US007876188B2

(12) United States Patent
Tarng et al.

(10) Patent No.: US 7,876,188 B2
(45) Date of Patent: Jan. 25, 2011

(54) GREEN TECHNOLOGIES: THE KILLER APPLICATION OF EMI-FREE ON-CHIP INDUCTOR

(75) Inventors: Min Ming Tarng, San Jose, CA (US); Mei Jech Lin, San Jose, CA (US); Eric Yu-Shiao Tarng, San Jose, CA (US); Alfred Yu-Chi Tarng, San Jose, CA (US); Angela Yu-Shiu Tarng, San Jose, CA (US); Jwu-Ing Nieh, San Jose, CA (US); Huang-Chang Tarng, San Jose, CA (US); Shun-Yu Nieh, San Jose, CA (US); Minh V Nguyen, San Jose, CA (US)

(73) Assignee: Tang System, San Jose, CA (US)

( * ) Notice: Subject to any disclaimer, the term of this patent is extended or adjusted under 35 U.S.C. 154(b) by 0 days.

(21) Appl. No.: 12/291,618

(22) Filed: Nov. 12, 2008

(65) Prior Publication Data

US 2009/0072875 A1   Mar. 19, 2009

Related U.S. Application Data

(63) Continuation-in-part of application No. 11/593,271, filed on Nov. 6, 2006, now Pat. No. 7,511,589.

(51) Int. Cl.
*H01F 38/30* (2006.01)
*H03B 5/08* (2006.01)

(52) U.S. Cl. ............... 336/84 M; 336/84 R; 331/117 R; 331/167

(58) Field of Classification Search ............... 336/84 M, 336/83, 84 R; 331/117 R, 117 FE, 167, 67; 257/531
See application file for complete search history.

(56) References Cited

U.S. PATENT DOCUMENTS

| 6,191,468 B1* | 2/2001 | Forbes et al. ............... 257/531 |
| 6,943,658 B2* | 9/2005 | Gardner ..................... 336/200 |
| 7,061,337 B2* | 6/2006 | Partovi et al. ............... 331/109 |
| 7,551,052 B2* | 6/2009 | Jow et al. .................. 336/84 M |
| 2005/0212611 A1* | 9/2005 | Muthali et al. ........... 331/117 R |
| 2007/0052062 A1* | 3/2007 | Ding et al. .................. 257/528 |
| 2009/0146750 A1* | 6/2009 | Pernia et al. ............ 331/116 R |

* cited by examiner

*Primary Examiner*—Robert Pascal
*Assistant Examiner*—Ryan Johnson

(57) ABSTRACT

The EMI-free planar inductor is the core technology of the green technology. The EMI-free planar inductor adopts the structure of the closed magnetic field flux IC inductor (CMF-FICI). All the magnetic field is confined in a small volume. The magnetic field is parallel to the surface of the chip. The EMI-free planar inductor makes the on-chip LC tank having very high Q and saves a lot of energy. Combining with the gain-boost-Q technology, it makes the high performance clock chip being comparable to the xtalchip. The xtalchip is the inductor being replaced with the crystal in the gain-boost Q resonator. Furthermore, the EMI-free planar inductor makes the highest power efficiency boost-buck converter and the on-chip spinning motor. It makes the PC laser TV projector being implementable.

20 Claims, 36 Drawing Sheets

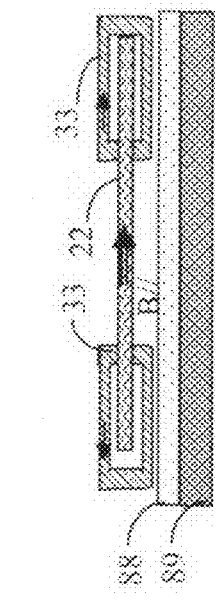
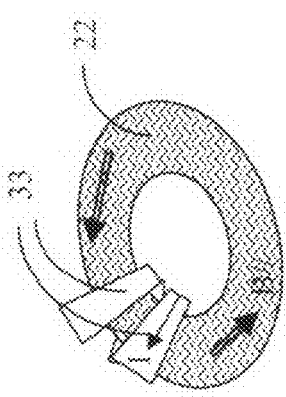
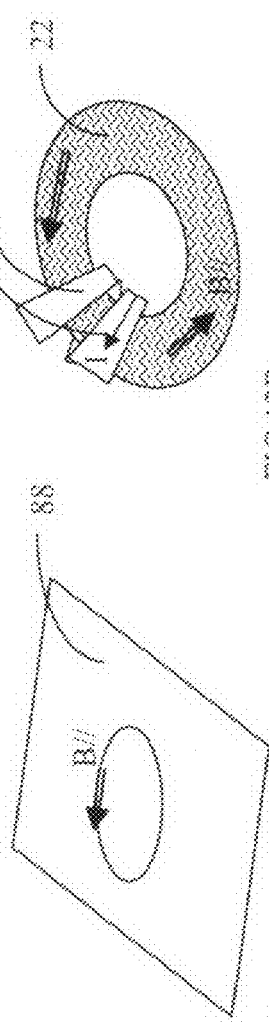
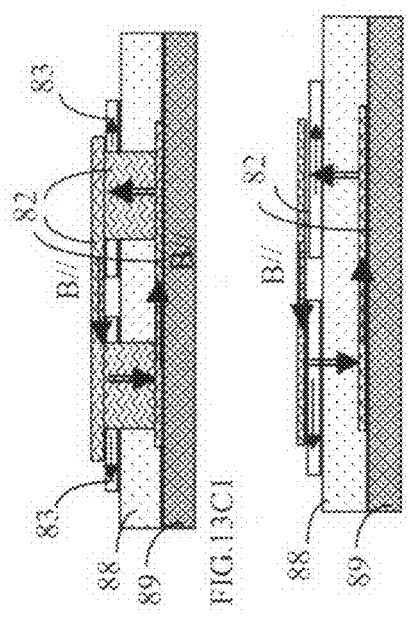
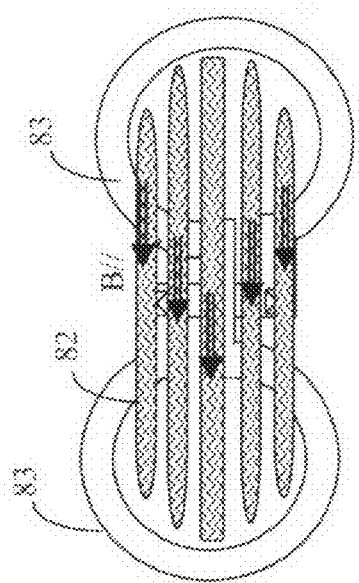
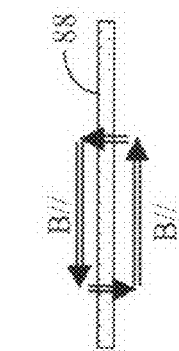

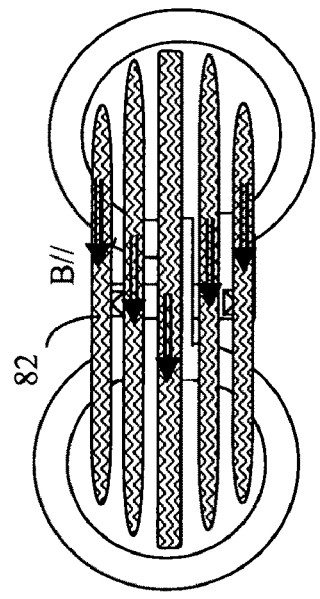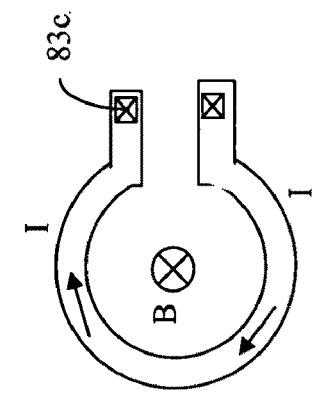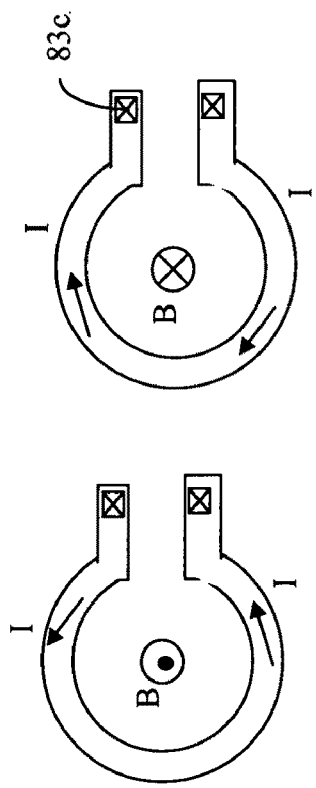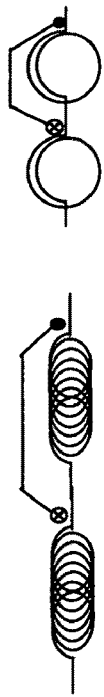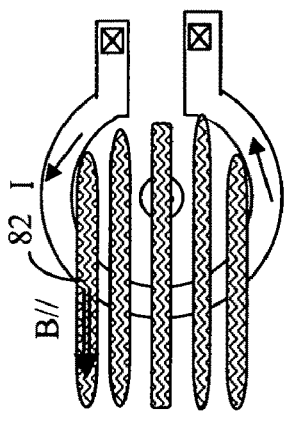

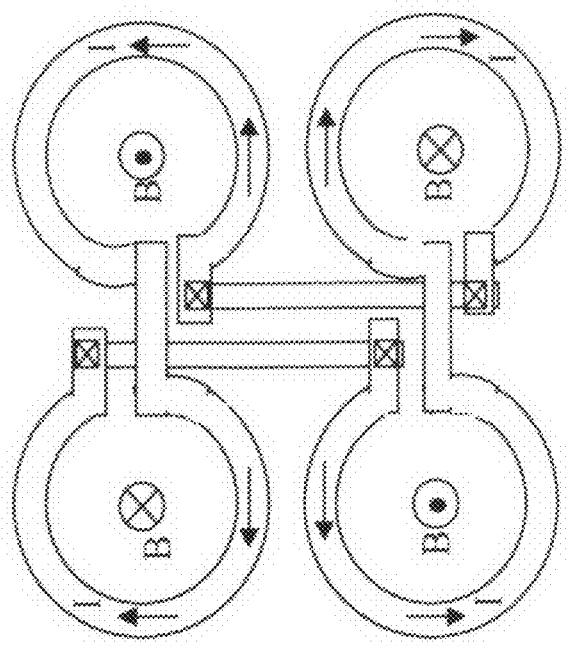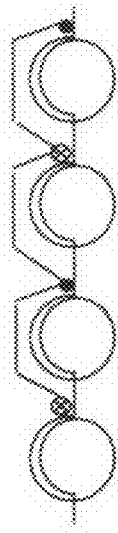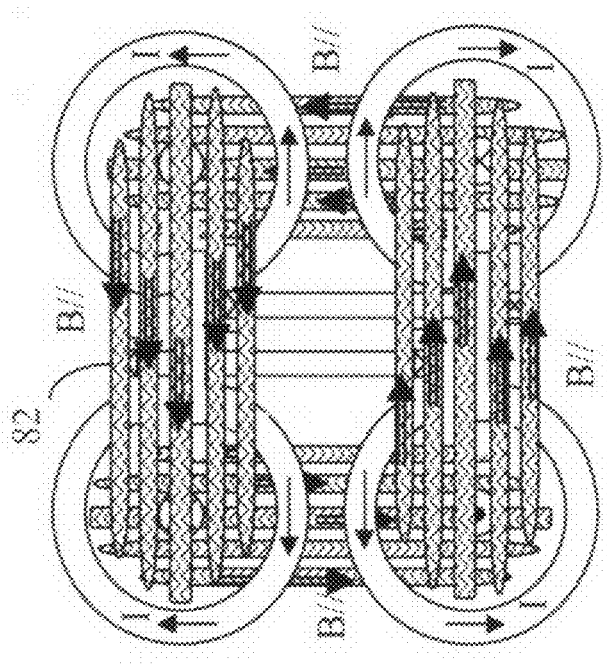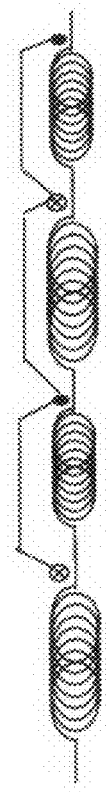
FIG.16B
FIG.16C2
FIG.16A
FIG.16C1

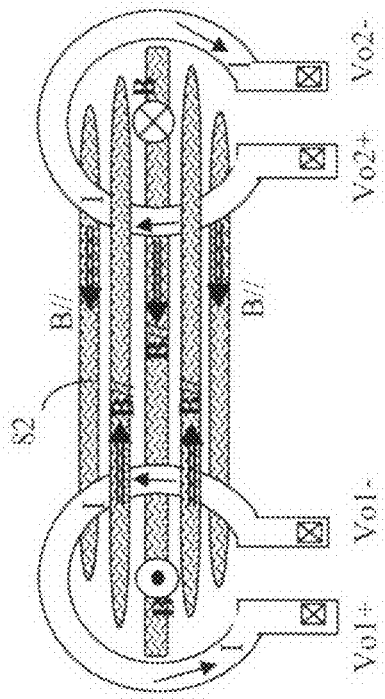
FIG.17A
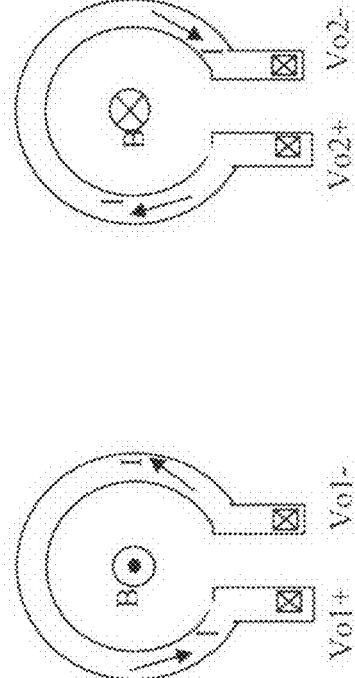
FIG.17B
FIG.17C1
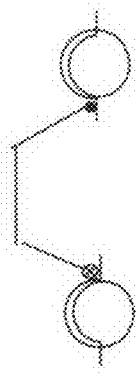
FIG.17C2

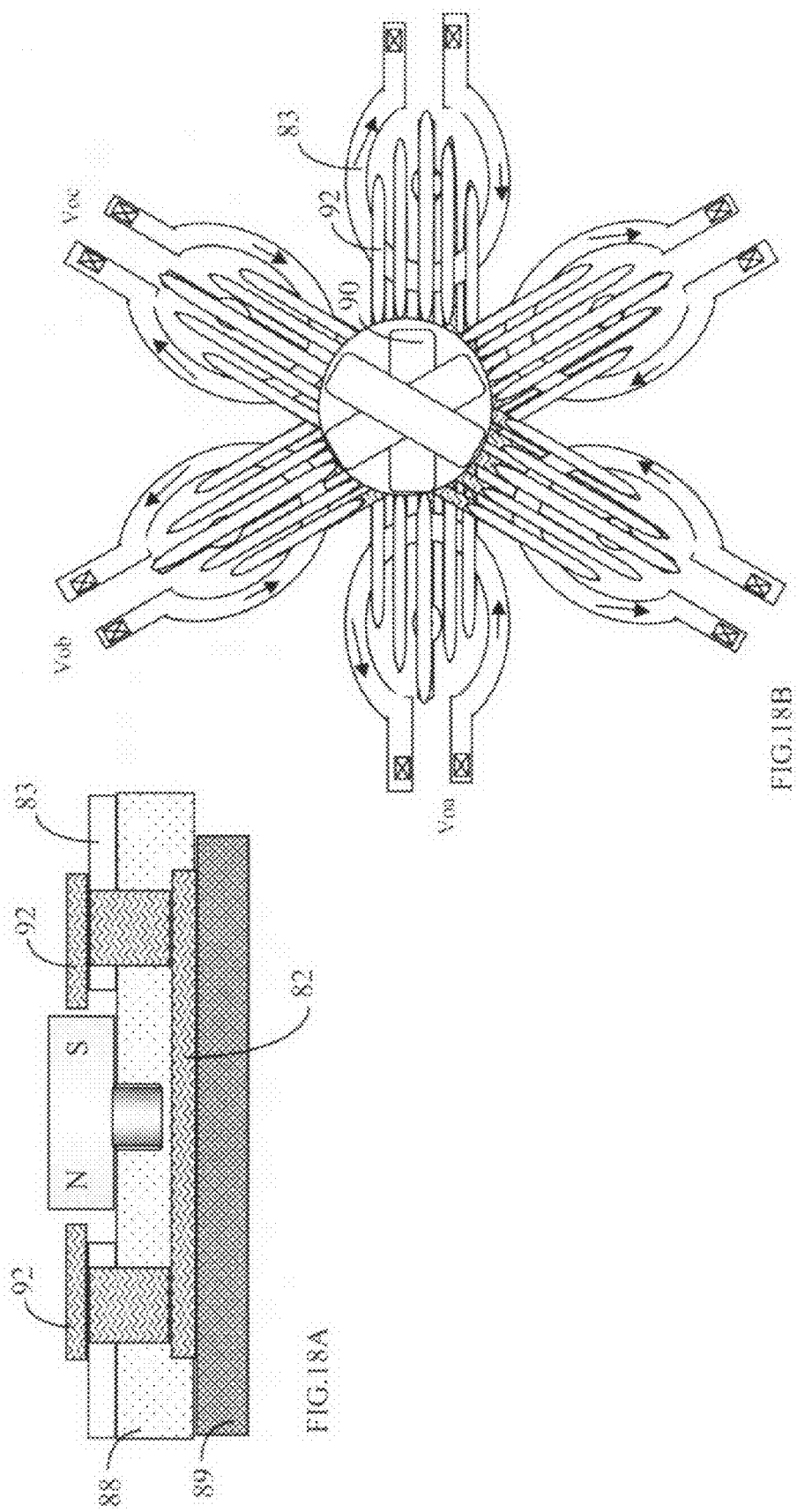

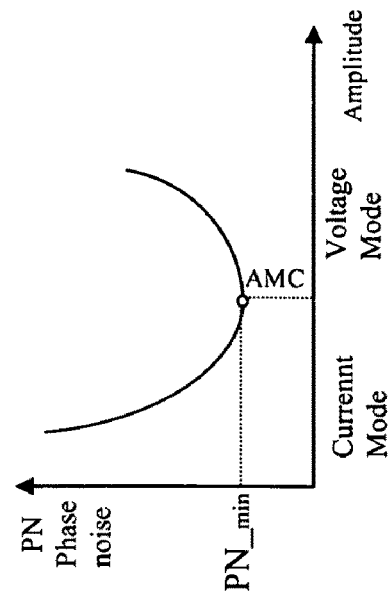
FIG.26D1
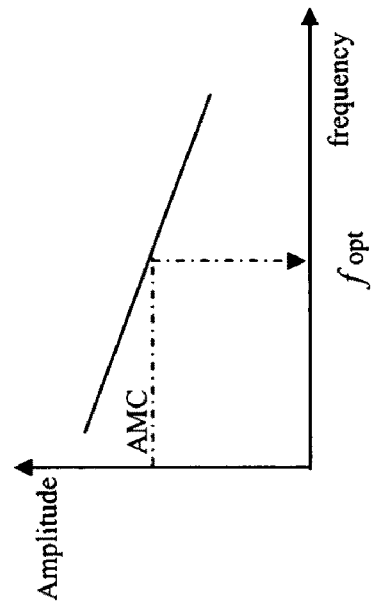
FIG.26D2
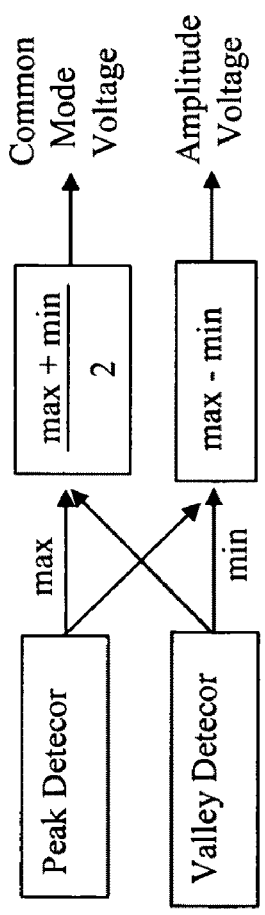
FIG.26B
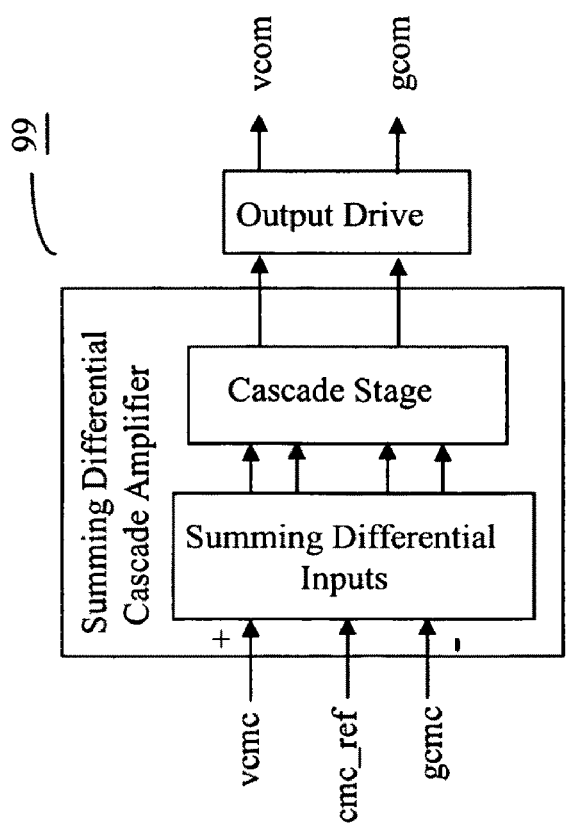
FIG.26C

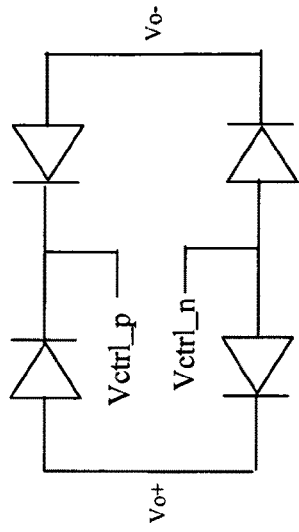
FIG.27C1
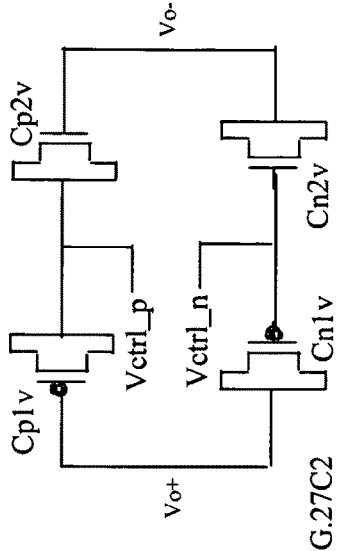
FIG.27C2
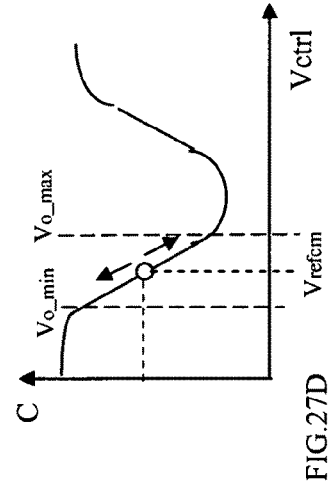
FIG.27D
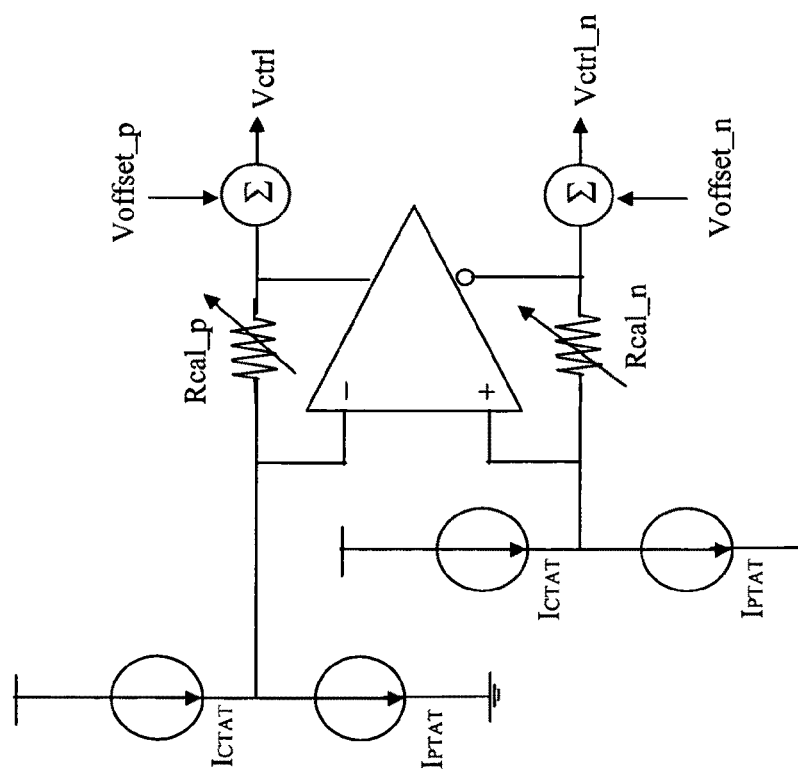
FIG.27B

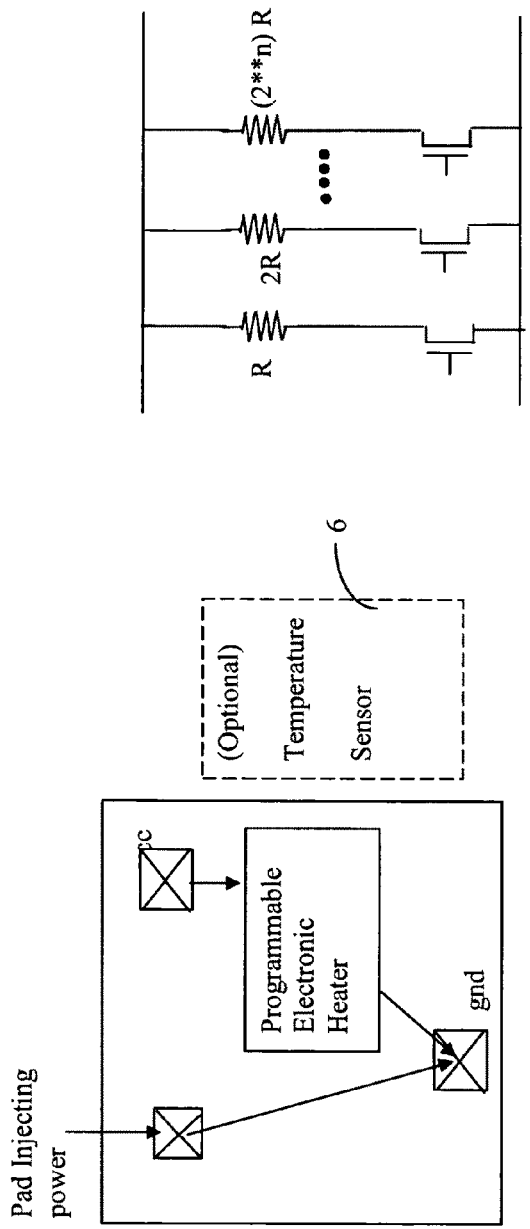
FIG.28A
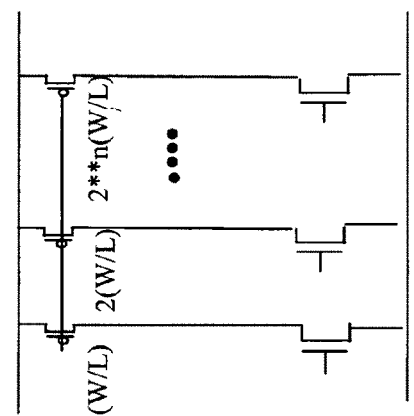
FIG.28B
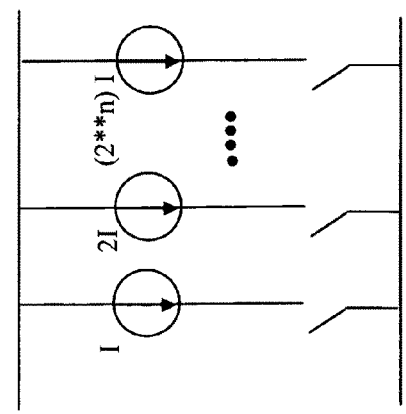
FIG.28C1
FIG.28C2

GREEN TECHNOLOGIES: THE KILLER APPLICATION OF EMI-FREE ON-CHIP INDUCTOR

This is a Continuation in Part application claiming priority of application Ser. No. 11/593,271, filed Nov. 6, 2006, now U.S. Pat. No. 7,511,589 which is herein incorporated by reference in its entirety.

BACKGROUND FIELD OF INVENTION

The US was the land of innovation. In the future, the US still will be the leader of world with 2G: Globalization with the Green innovative technology derived from the multi-disciplinary education. The EMI-Free On-Chip Inductor is the core technology of the Zilinx FPIC, Field Programmable Integrated Chip. The EMI-Free On-Chip Inductor is the Magnetic-Interference-Free MIF green technology. This Green Technology holder is Tang System. The killer application of the EMI-Free On-Chip Inductor is based on the green technology of Tang System to integrate the EMI-Free On-Chip Inductor with EMI-sensitive chip to be the high precision clock and noiseless on-chip switch power supply, etc. Thanks to the support of Dr. Mei Jech Lin, Eric Yu-Hsiao Tarng, Alfred Yu-Chi Tarng, Angela Yu-Shiu Tarng, Jwu-Ing Tarng, Huang-Chang Tarng, Shun-Yu Nieh that I can make the revolutionary innovations in the Zilinx' holding company, Tang System.

The fundamental problem of the hazard of US economic is the loss of productivity in technology innovation to maintain the high quality living standard. The loss of technology innovation capability is due to the mistake in the US value system of the money game. Everybody is smart. Nobody is foolish to invest in the innovation oriented multi-disciplinary education anymore. Everybody wants to be Harvard's MBA to play the money game in the Wall Street. Finally, the game is over. The US governor admits they are wrong in economic policy. However, they should admit the mistake in the value system. It takes 30 years to prove this is the completely wrong track. Therefore, the US comes back to the technology innovation track again.

Furthermore, there is another terrible mistake. US should push the globalization with the innovative Green technology. Before, the greedy US uses a lot of energy. The fatal mistake is the globalization. Now, the global movement spreads the US life style to the world. Everybody in China starts to drive the automobile as the US people do. Suddenly, the world is short of the oil. Even worse, the earth starts become warm. The ice in the North Pole disappears. It is disaster. Even worse, there is the unbelievable weather change. For example, in the Pacific Ocean, the typhoon directly runs toward to Taiwan once a week in 2008. For two months, eight typhoons hit the Taiwan directly. The record is a typhoon once a week. It is unbelievable. Therefore, to save the earth, the green technology concept is brought up. Before it is too late, to make up this mistake, the US needs to continue pushing the globalization with the innovative Green technology now.

However, the problems of the green technology are not formalized. The people even fail to recognize the problems of the green technology. Therefore, we are not only recognizing the problems of the green technology but also formalizing the problems of the green technology. From the formalization of the green technology problems, the on-chip inductor is the technical bottleneck of the green technology.

There are three fundamental problems for the on-chip inductor. The first problem is the low-Q of the on-chip inductor. The second problem is the on-chip EMI interference which is not considered by the RF designer yet. The EMI-free concept means the magnetic field in the inductor is not leaked outside. The EMI-Free inductor has magnetic confinement and magnetic shielding for the magnetic interference of external environment, internal circuit and itself. So, EMI-Free inductor is also named as the Magnetic-Interference-Free MIF. The third problem is the inductance of the on-chip inductor is very small that the external on-board inductor still needs.

The derived problem from the three fundamental problems for the on-chip inductor is the low power efficiency due to the low Q. The inductor cannot store much more energy. It causes the low-Q and low power storage problems of on-chip inductor. To drive the low-Q and low power storage on-chip inductor, it needs a lot of current and power into the circuit. Therefore, the on-chip LC resonator needs large current and consumes a lot of power. Therefore, the green technology core is to make the innovation in the on-chip inductor to solve the low-Q, on-chip EMI inductor problem.

Furthermore, for the student, the projector is much more important than the camera. The student needs to make the presentation with the projector. Almost all the notebook PC has the camera today. Why does the notebook not have the projector? The reason for the notebook having no projector is the low-Q and low power density on-chip inductor. Solving the low-Q and low power density on-chip inductor problems, all the notebook can have the projector.

DESCRIPTION OF PRIOR ART

To solve the on-chip inductor problem, we need to apply the multi-disciplinary education to the IC development. However, due to the missing educational mode of the multi-disciplinary education in US education system, the IC technology developer has no knowledge base to make the innovation at all. Not to mention to apply the multi-disciplinary knowledge base to the IC chip design, Today, the on-chip inductor is the metal wire spiral around on the top layers of the chip. The magnetic field is perpendicular the surface of the chip. The magnetic field line makes interference with the other components on the chip. The area of inductor takes a lot of layout area of the chip. However, the inductor only spiral around a few circle. To generate enough magnetic field, the current flowing through the inductor has to be large. The on-chip inductor wastes a lot of power that it is not the green component in the green technology.

Inductor is the most important element in the design of mixed signal system for integrated circuits (IC) especially for self-timing circuits such as Xtaless Clock chip. All prior art designs have a weakness of using conventional IC inductor. The prior designs have poor performance of low Q inductor. The Q is less than 10. Some designers address this issue by using MEM technology, bonding wires or post processing.

MEM technology is expensive and the fundamental frequency is low. MEM technology requires another PLL to boost the frequency up. This frequency boost up process will degrade the phase noise which is a well-known problem in electronic engineering.

Both bond wire and conventional post process can improve the Q of the inductor to be a value of about 40. Nevertheless, they still did not address the most important issue of environment sensitivity of the self-generating oscillatory circuit. They are very sensitive to external environmental variables. In some prior-arts, the inductor design adopts shielding. However, they are the shields for electric field, not for magnetic field shield. Their shielding materials are the metals such as Cu or Al which is not magnetic material. Magnetic field flux still penetrates through these shielding metals.

Furthermore, the on-chip inductor forbids many killer applications such as the PC projector with the laser TV projector. The Laser TV is the conjugate TV technology of the electronic TV. The Laser TV concept is never realized due to the high cost. The success of the large size LCD flat panel makes the Laser TV to be impossible to survive. However, due to the advancement of the digital light processor DLP, a lot of DLP technology can be applied to the Laser TV. The only problems are whether it can be low power. To have the low power and compact Laser TV, the most important is the high power efficient on-chip inductor.

OBJECTS AND ADVANTAGES

The EMI-Free On-Chip Inductor has the high-Q, high power density and zero EMI interference with the other on-chip RF circuits, etc. The EMI-Free On-Chip Inductor has all the magnetic energy confined in small volume. It increases the magnetic energy density and the Q of the LC resonator. It reduces the power consumption of the LC resonator. It make the compact and low power Laser TV to be implementable that every notebook PC has one Laser Projector to serve as both the Laser TV in the entertainment and Laser Projector in the education.

DRAWING FIGURES

FIG. 12 is the horizontal loop EMI-free planar inductor to confine the magnetic field to be the B// magnetic field; (A) is the magnetic field being confined to be B//; (B) is the coil and core confinement to confine the magnetic field to be B//; (C) the section view of the horizontal loop of the coil and core confinement.

FIG. 13 is the vertical loop EMI-free planar inductor to confine the magnetic field to be the B// magnetic field; (A) is the magnetic field being confined to be B//; (B) is the coil and core confinement to confine the magnetic field to be B//; (C1) is the section view of the horizontal loop of the coil and core confinement having no vertical gaps; (C2) is the section view of the horizontal loop of the coil and core confinement having the vertical gaps; (C3) is the section view of the horizontal loop of the coil and core confinement having the vertical gaps and bottom horizontal gap.

FIG. 14 shows the single loop EMI-free planar inductor; (A) is the top view of the single loop EMI-free planar inductor; (B1) is the magnetic field point downward single loop; (B2) is the magnetic field pointing upward single loop; (C1C) is the circuit symbol of the magnet pointing upward EMI-free planar inductor; (C1L) is the layout and circuit symbol of the magnet pointing upward EMI-free planar inductor; (C2C) is the circuit symbol of the magnet pointing downward EMI-free planar inductor; (C2L) is the layout and circuit symbol of the magnet pointing downward EMI-free planar inductor.

FIG. 15 shows the dual loop EMI-free planar inductor; (A) is the top view of the dual loop EMI-free planar inductor; (B) is the dual loop; (C1) is the circuit symbol of the dual loop EMI-free planar inductor; (C2) is the layout and circuit symbol of the dual loop EMI-free planar inductor.

FIG. 16 shows the quadratic loop EMI-free planar inductor; (A) is the top view of the quadratic loop EMI-free planar inductor; (B) is the quadratic loop; (C1) is the circuit symbol of the quadratic loop EMI-free planar inductor; (C2) is the layout and circuit symbol of the quadratic loop EMI-free planar inductor.

FIG. 17 shows the conjugate loop EMI-free planar inductor; (A) is the top view of the conjugate loop EMI-free planar inductor; (B) is the conjugate loops; (C1) is the circuit symbol of the conjugate loop EMI-free planar inductor; (C2) is the layout and circuit symbol of the conjugate loop EMI-free planar inductor.

FIG. 18 is the application of the EMI-free planar inductor to the MEM type brushless DC motor; (A) is the section view of the MEM type brushless DC motor; (B) is the top view of the MEM type brushless DC motor.

Figure 19:
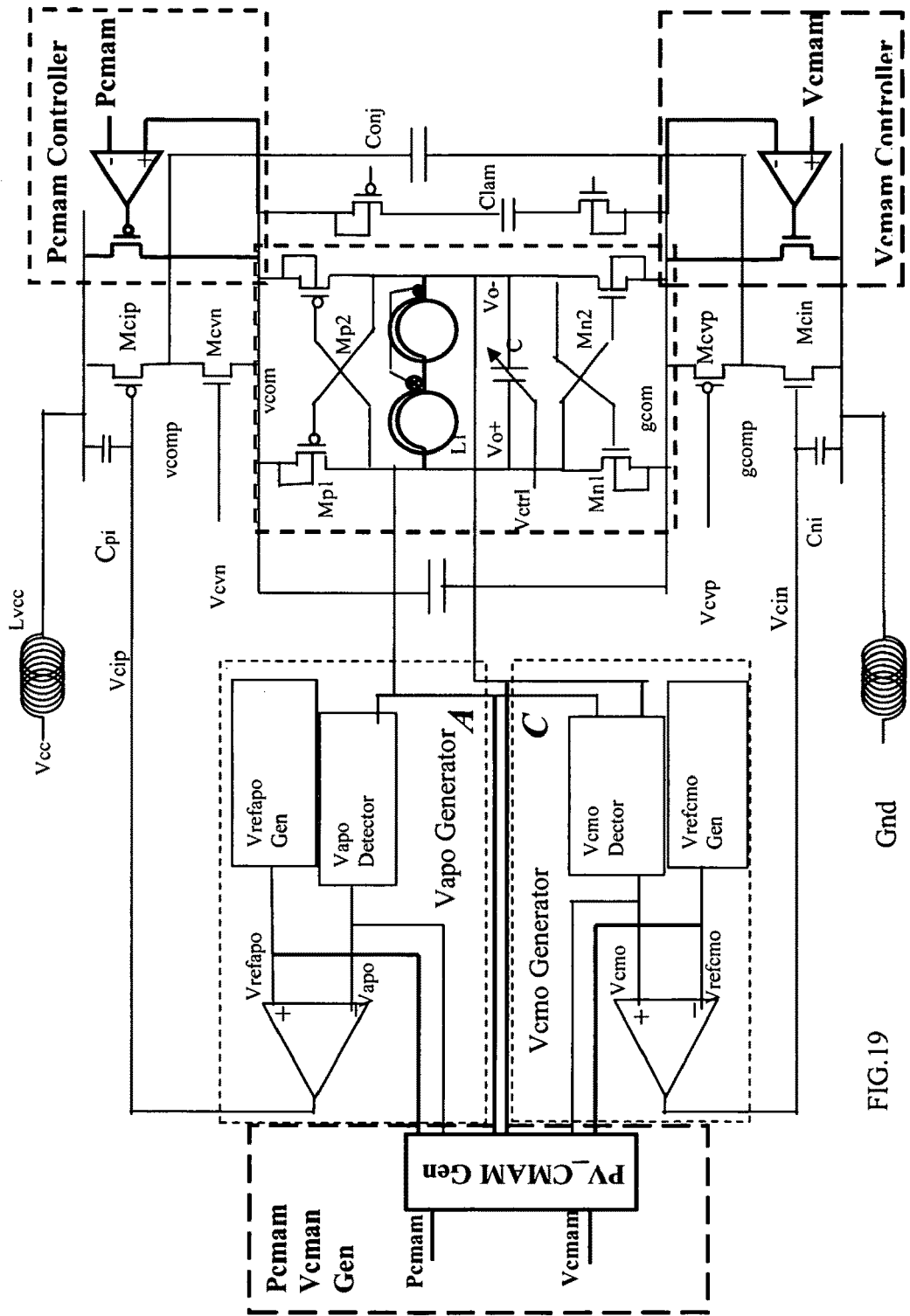

FIG. 19 is the common-mode and amplitude-mode control gain-boost-Q LC resonator having the EMI-free planar inductor.

Figure 20:
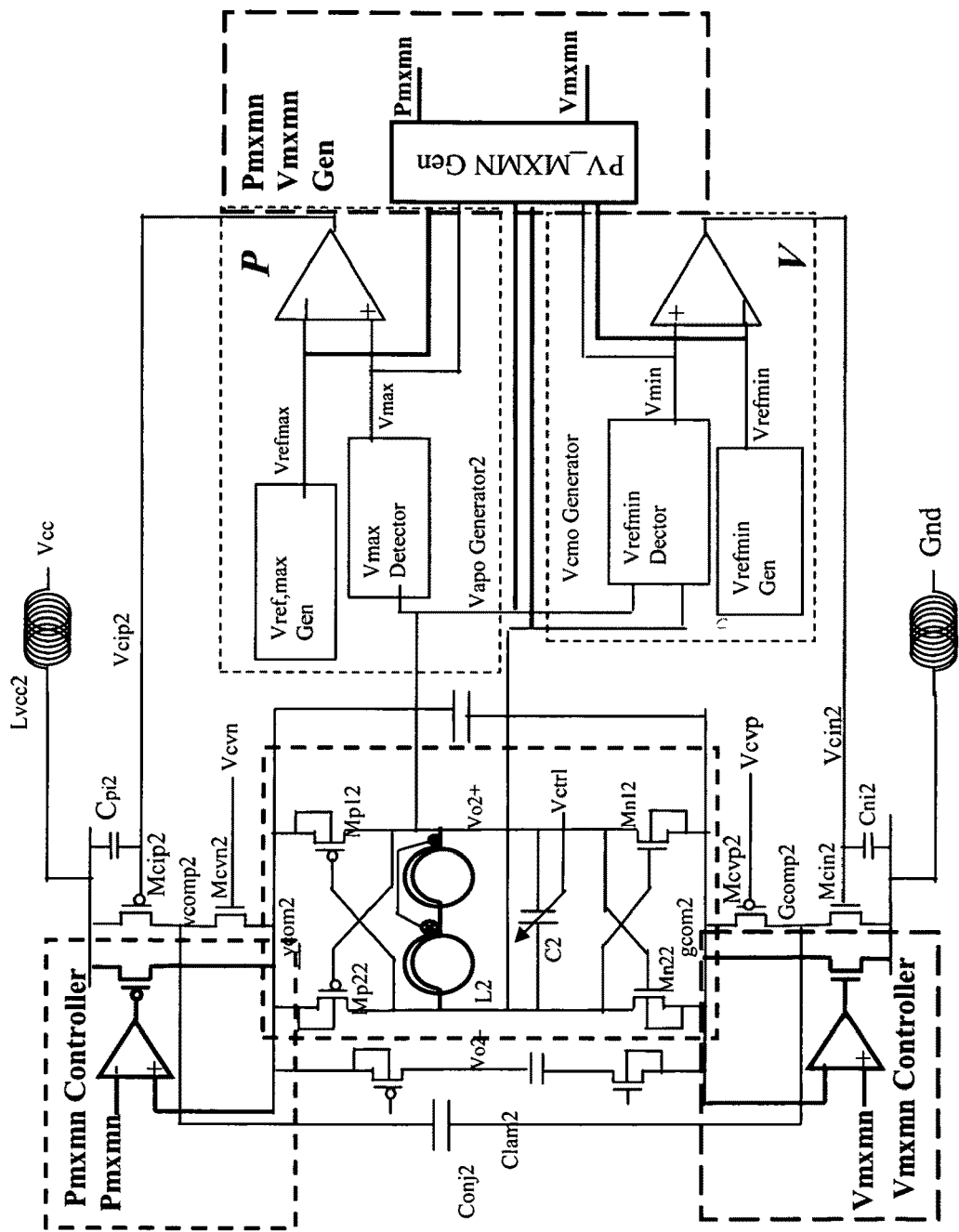

FIG. 20 is the peak-mode and valley-mode control gain-boost-Q LC resonator having the EMI-free planar inductor.

Figure 21:
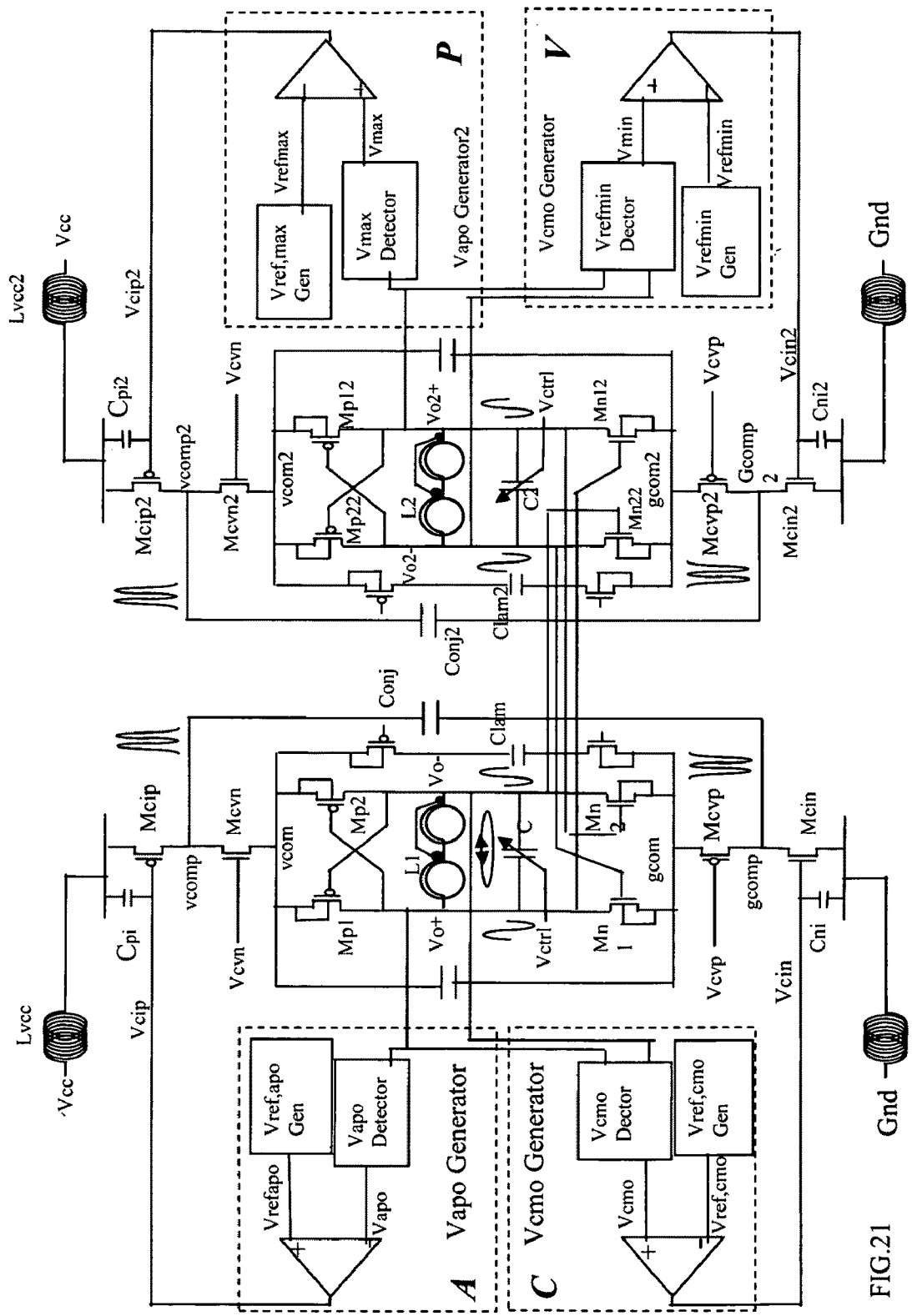

FIG. 21 is the gain-boost-Q quadratic LC resonator having the EMI-free planar inductor with the common-mode, amplitude-mode control, peak-mode and valley-mode control.

Figure 22:
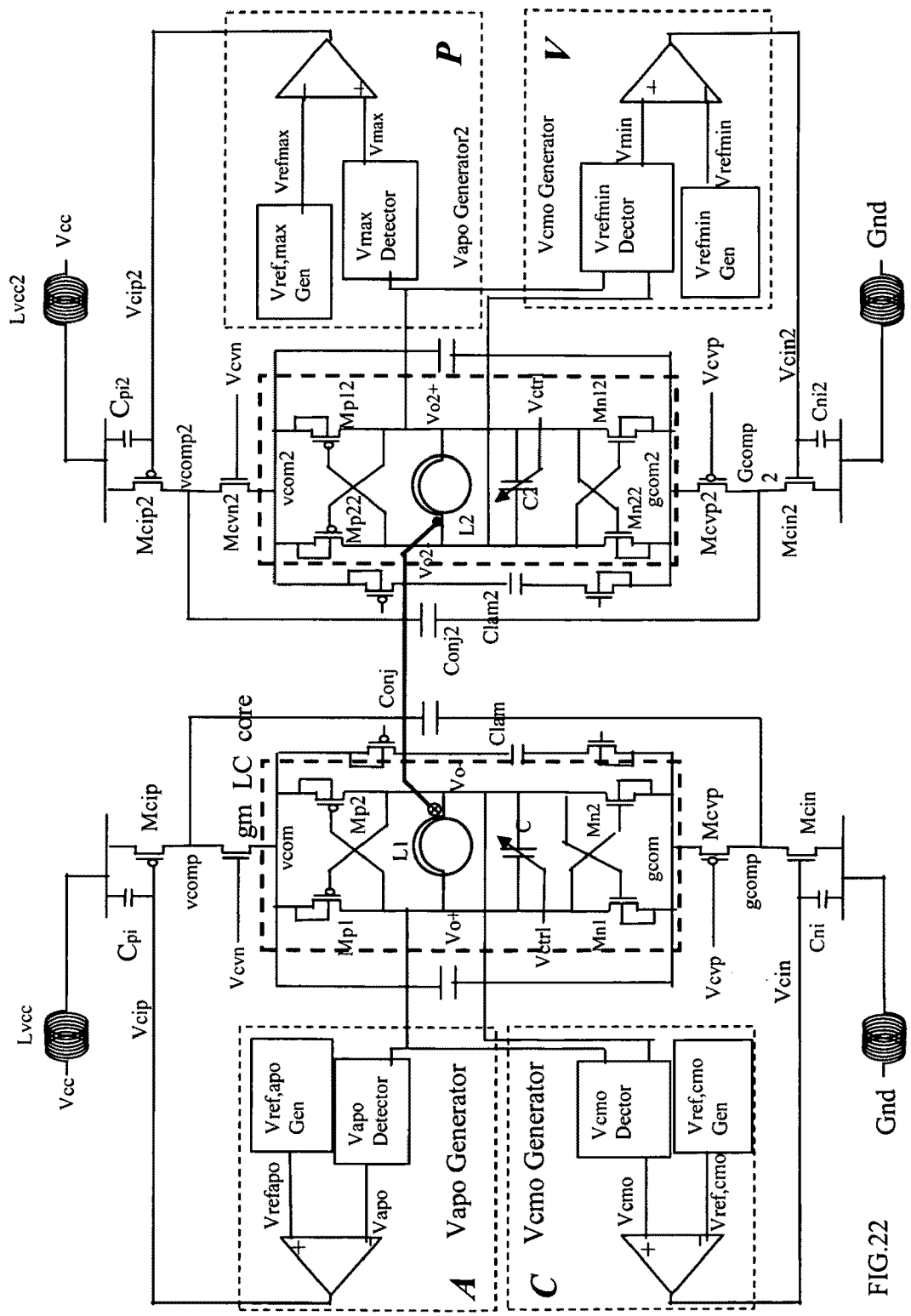

FIG. 22 is the gain-boost-Q conjugate LC resonator having the magnetic-coupled EMI-free planar inductor with the common-mode, amplitude-mode control, peak-mode and valley-mode control.

Figure 23:
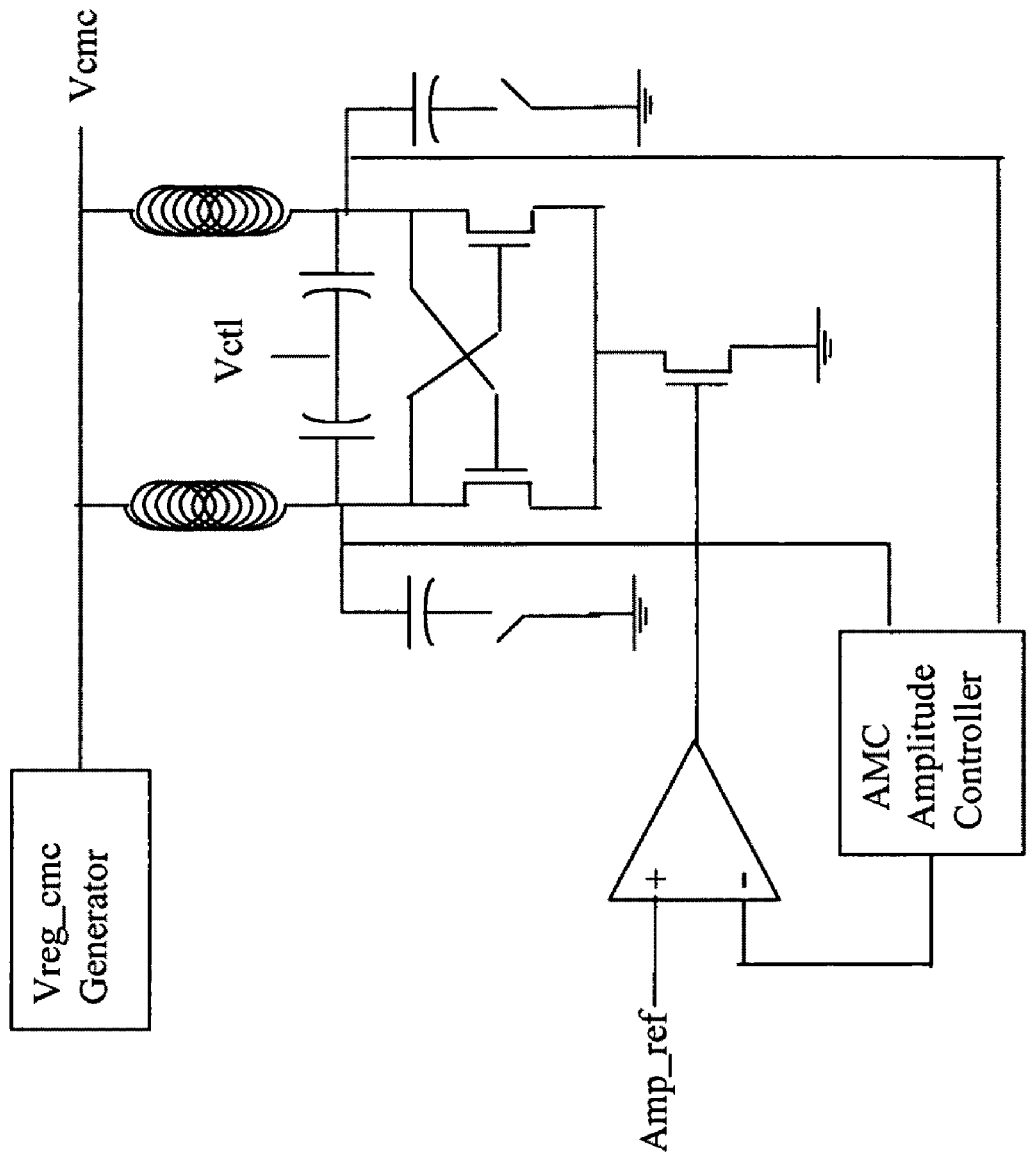

FIG. 23 is the N-type gain-boost-Q LC resonator having the amplitude-mode control.

Figure 24:
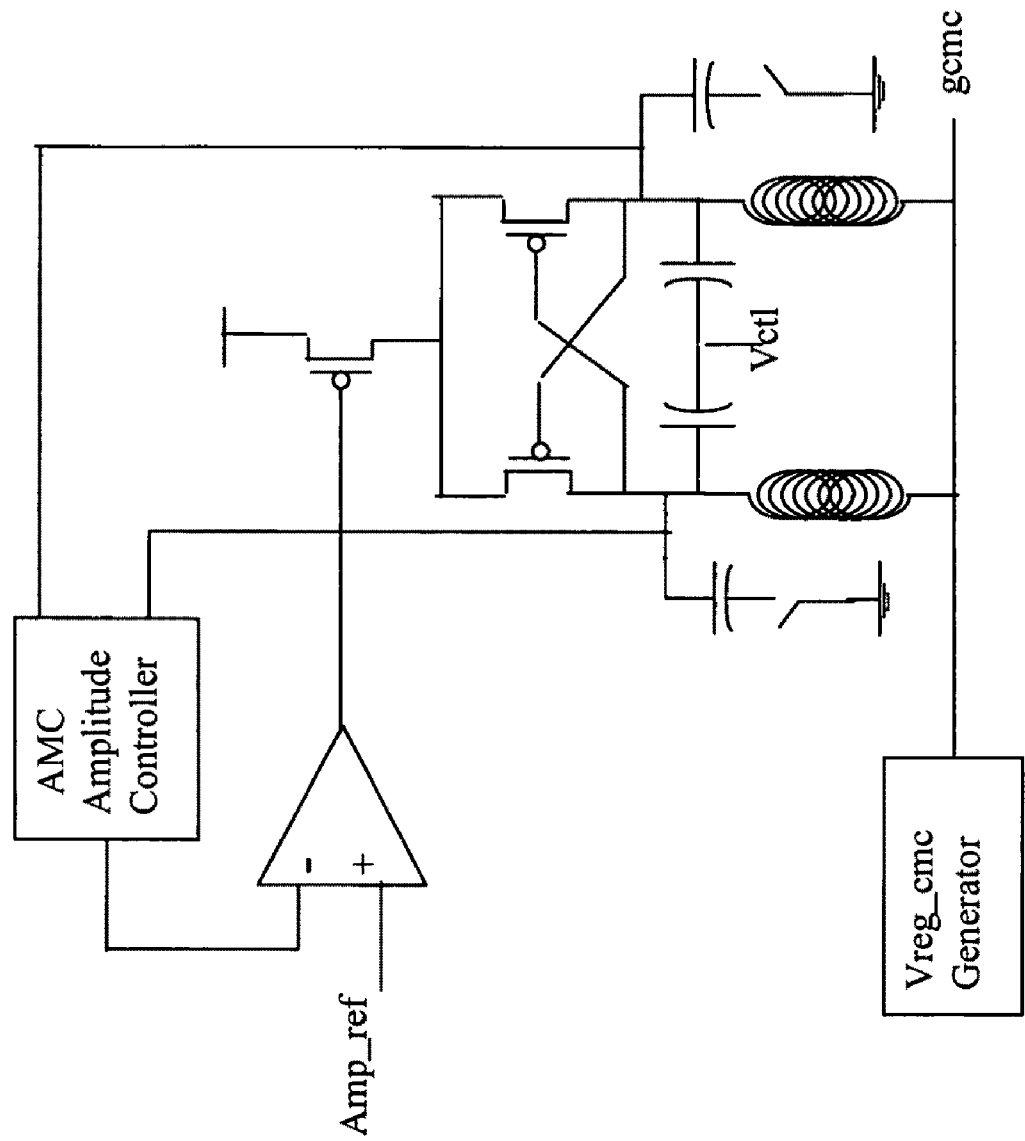

FIG. 24 is the P-type gain-boost-Q LC resonator having the amplitude-mode control.

Figure 25:
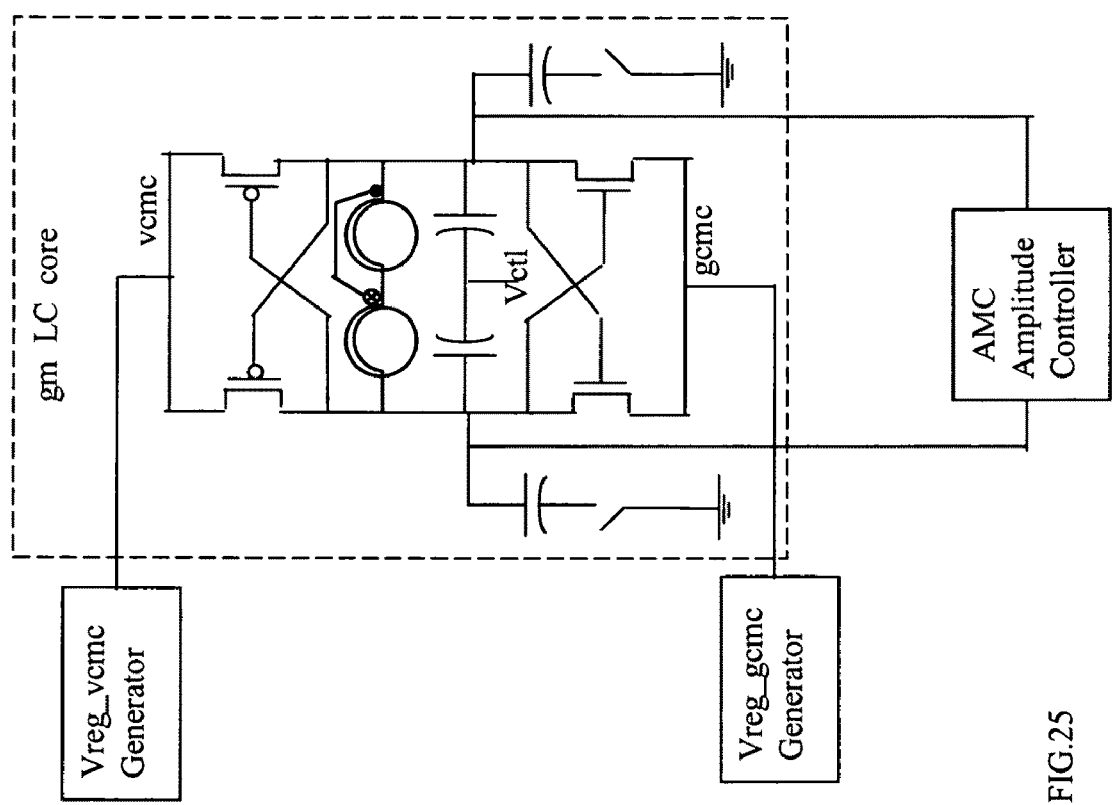

FIG. 25 is the gain-boost-Q LC resonator having the amplitude-mode control and voltage regulating generators.

FIG. 26 (A) is the architecture and schematic block diagram of the noiseless gain-boost-Q LC resonator; (B) is the block diagram of the common mode voltage and amplitude mode voltage generated from the peak mode voltage and valley mode voltage; (C) is the adaptive power opamp for the gm LC resonator core; (D1) the adaptive control for the minimum phase noise of the noiseless gain-boost-Q LC resonator; (D2) is the adaptive jitterless/spurfree frequency control for the noiseless gain-boost-Q LC resonator.

FIG. 27 is the test and calibration system for the temperature compensation; (A) is the differential control voltage for the varactor; (B) is the temperature compensation circuit for the differential control voltage for the varactor; (C1) is the differential variable capacitance made of the diode; (C2) is the differential variable capacitance made of the varactor; (D) the characteristics curve of the varactor to show the differential compensation in the variation of the output voltage Vo.

FIG. 28 (A) is the on-chip heater for the test; (B) is the heater with variable resistance array; (C1) is the heater with various current source array; (C2) is the implementation of the heater with various current source array.

FIG. 29 (A) is the high power efficiency boost-buck converter voltage regulator having siphon effect to minimize the switch loss; (B) single input multiple output high power efficiency boost-buck converter voltage regulator.

Figure 30:
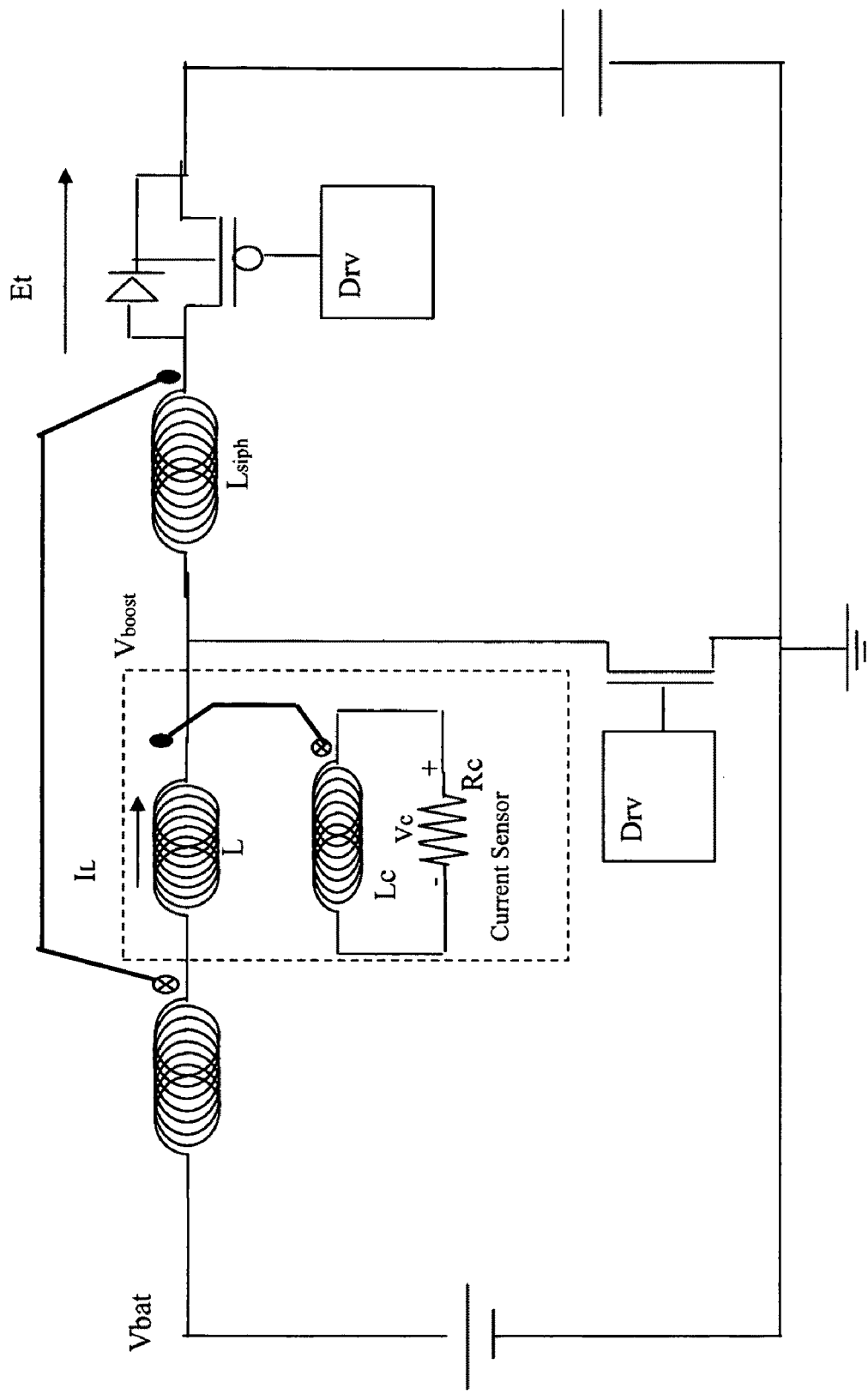
Figure 31A:
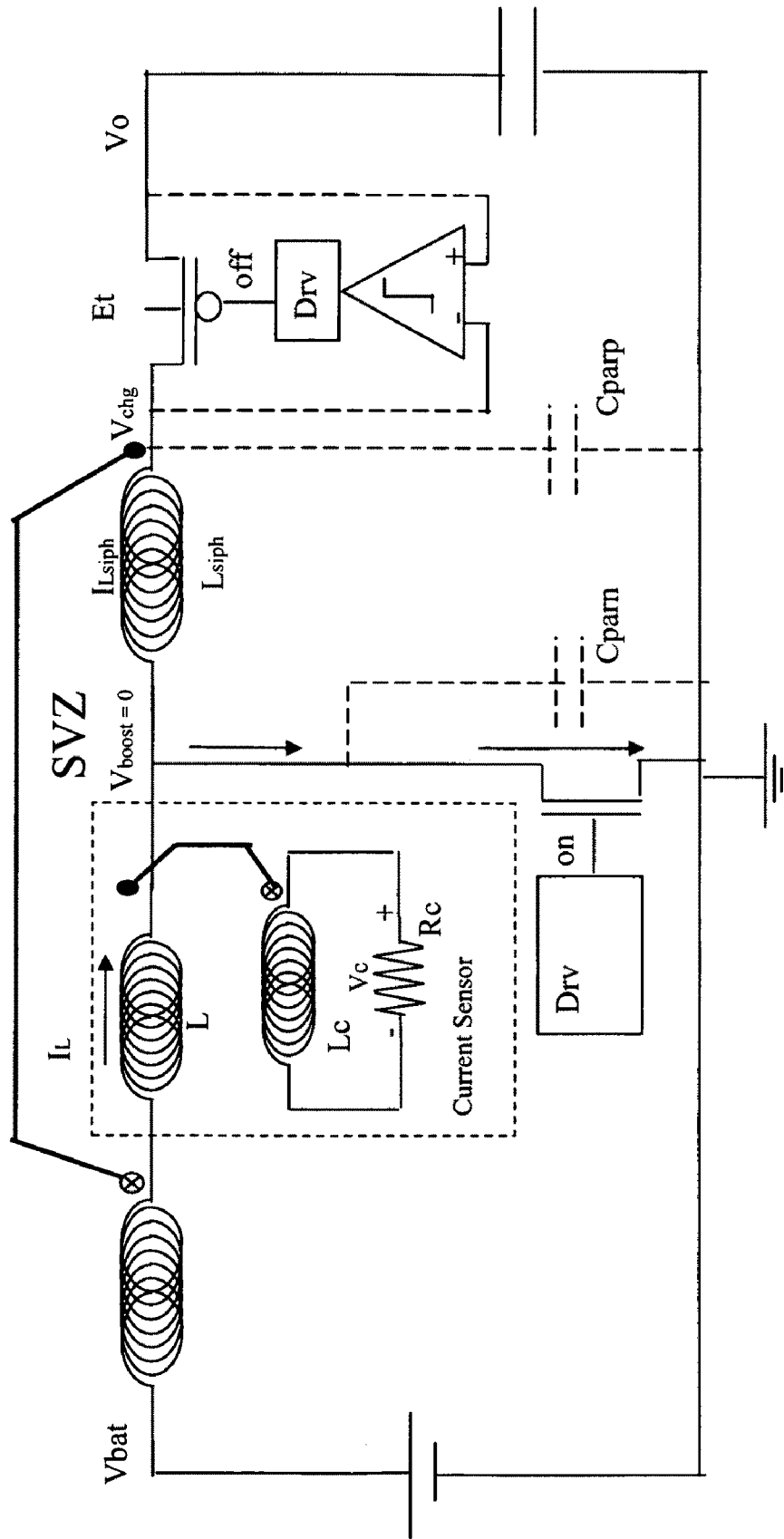
Figure 31B:
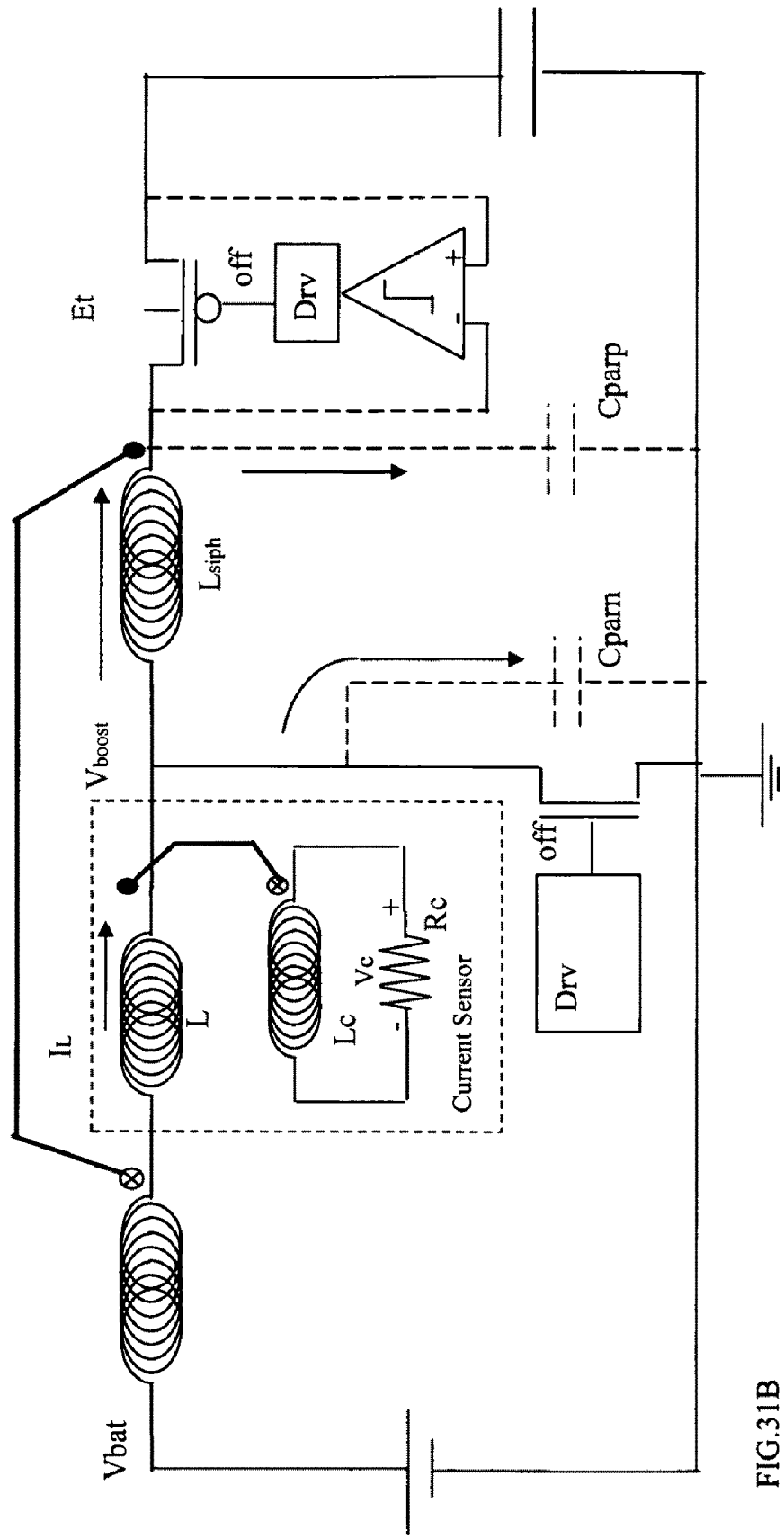
Figure 31C:
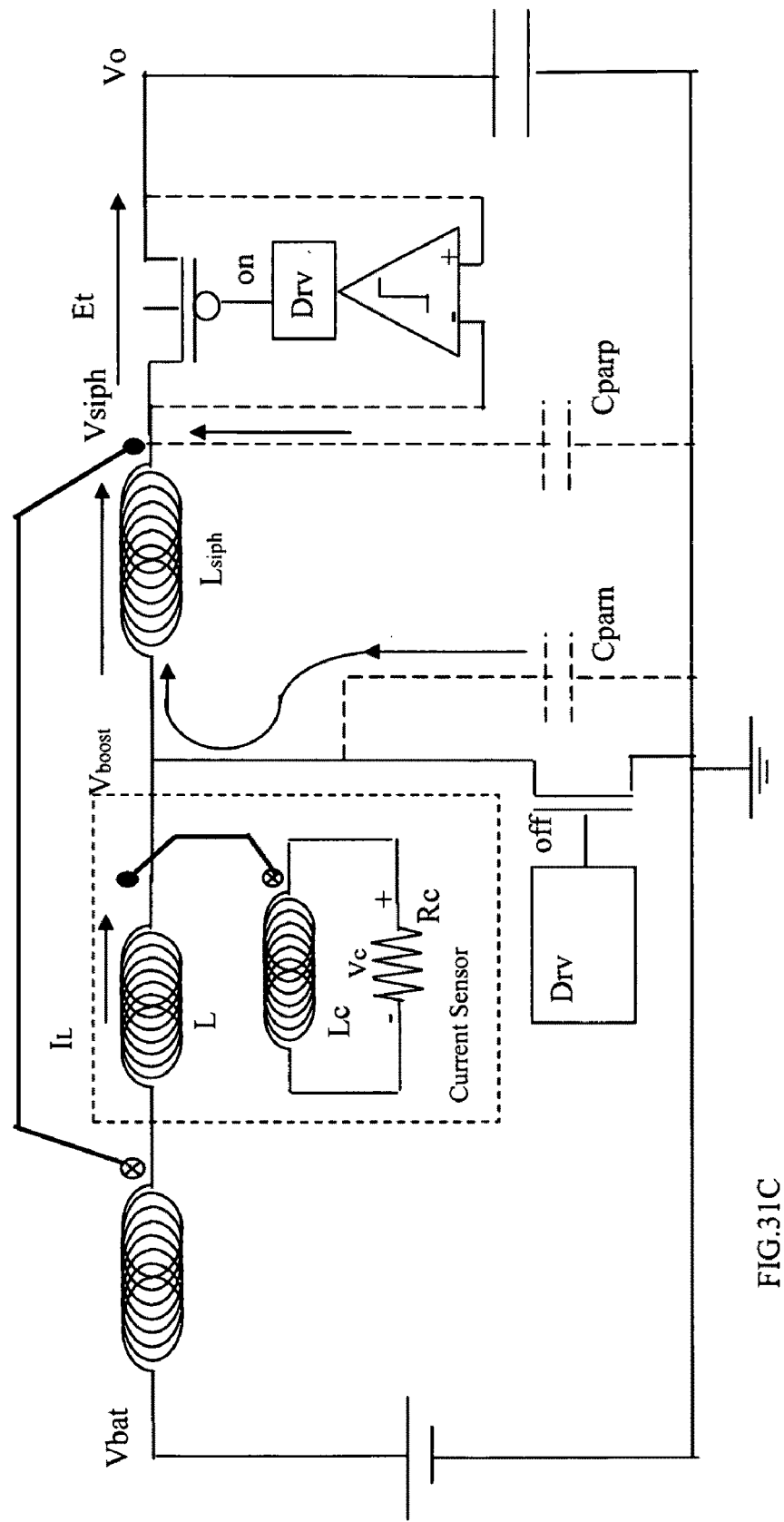
Figure 31D:
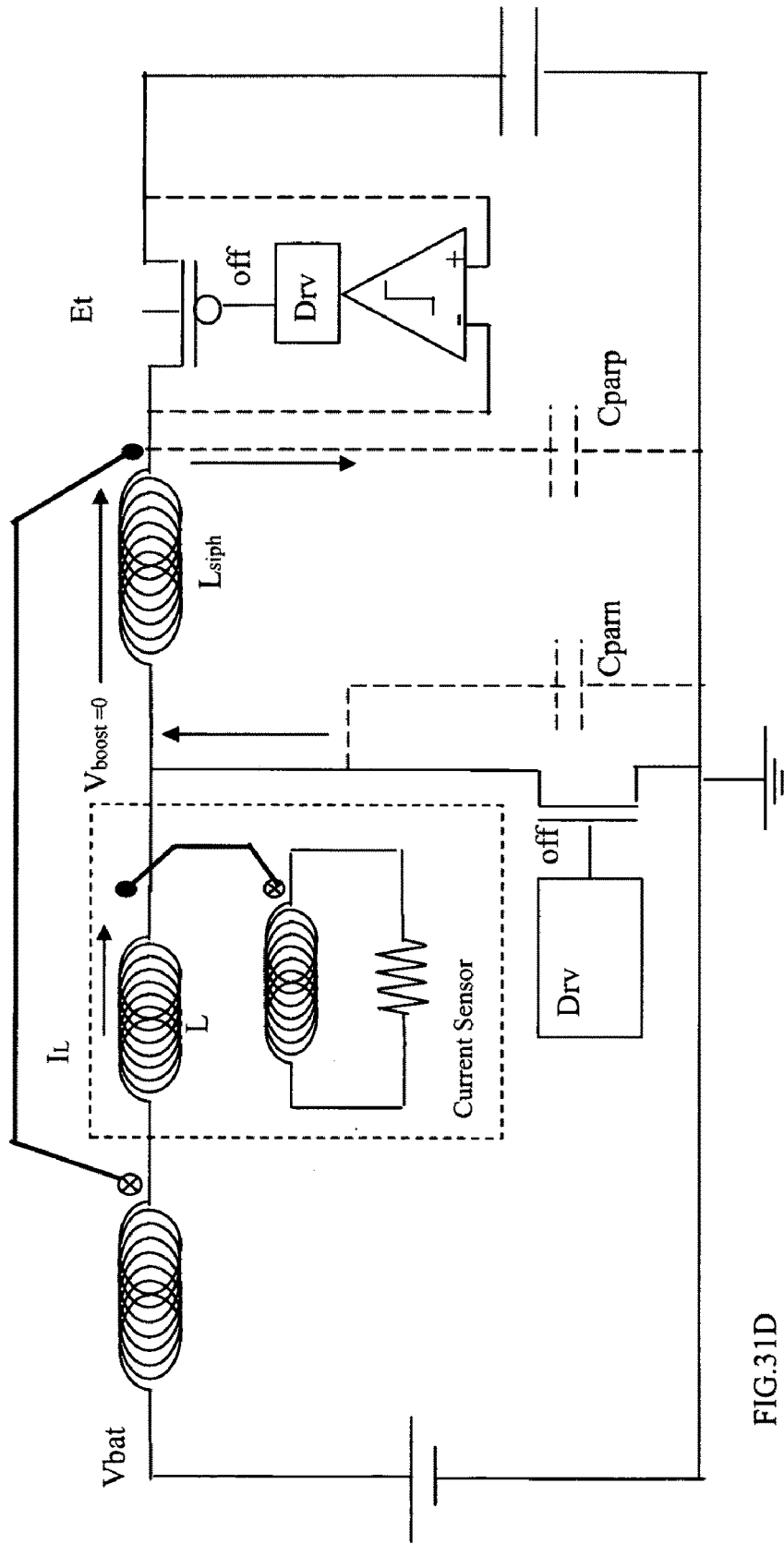

FIG. 30 is the boost-buck converter having the resistorless current sensor and the siphon mechanism made of the magnetic coupled EMI-free planar inductors.

FIG. 31 is the operation of the high power efficiency boost-buck converter voltage regulator; (A) the NMOS switches on to build up the inductor current; (B) the NMOS switches off and the inductor current starts to boost up and charge up the parametric capacitors; (C) the PMOS switches on and the siphon inductor sucks the charges from the parametric capacitors; (D) the boost voltage decreases to zero due to the suck of the charge from the boosting node; then the boost controller will switch to FIG. 31A state to start the next boost cycle.

Figure 32:
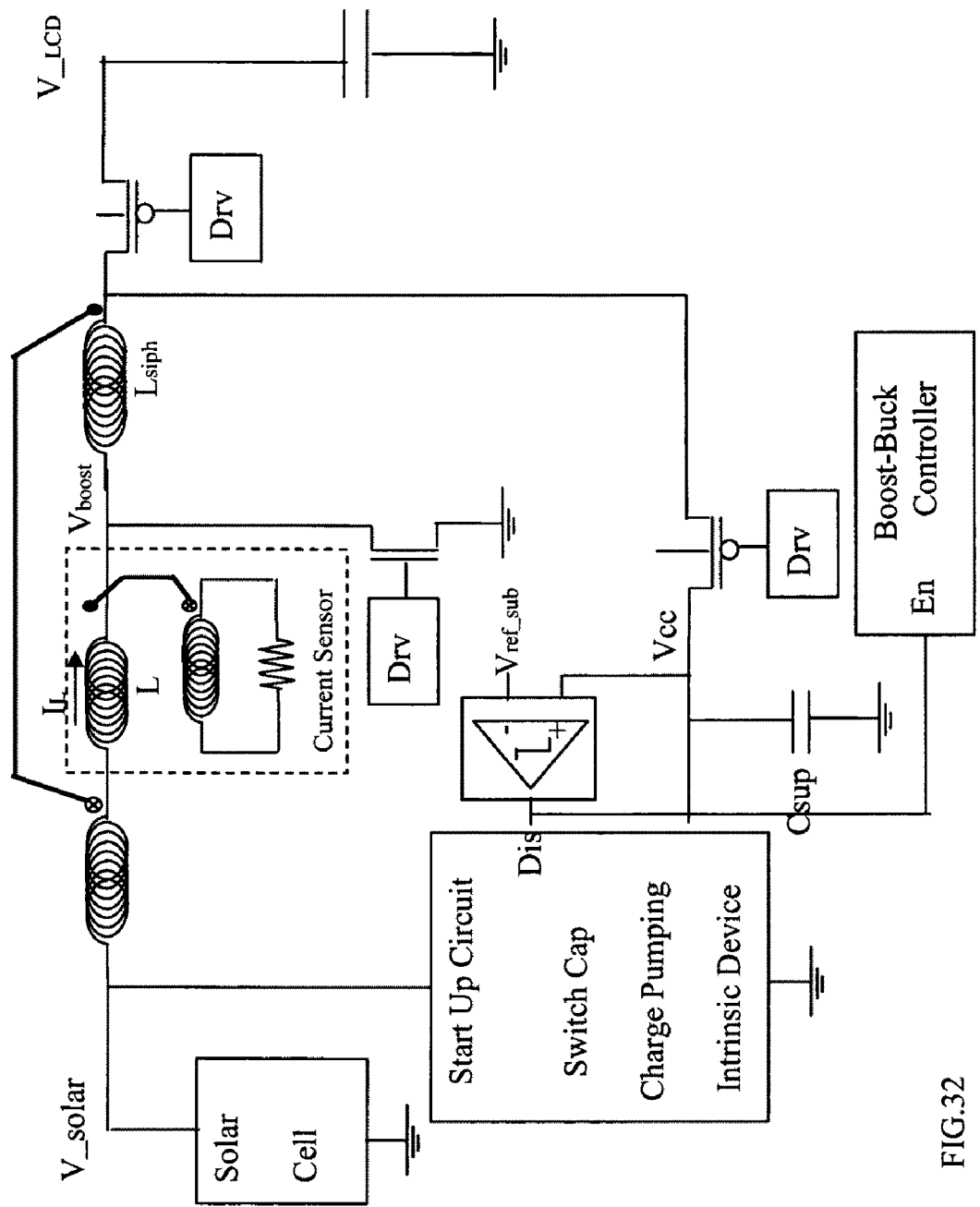

FIG. 32 is the solar cell boost-buck converter having the EMI-free planar inductor.

FIG. 33 is the device process for the EMI-free planar inductor; (A) is the growth of the bottom magnet core segment; (B) is the growth of the isolation layer; (C) is the growth of the coil segment; (D) is the etching for the magnet core; (E) is the growth of the top magnet core segment.

FIG. 34 is the alternative device process for the EMI-free planar inductor; (A) is the growth of the coil segment; (B) is the etching for the magnet core; (C) is the two-side growth of the magnet core segment.

Figure 35:
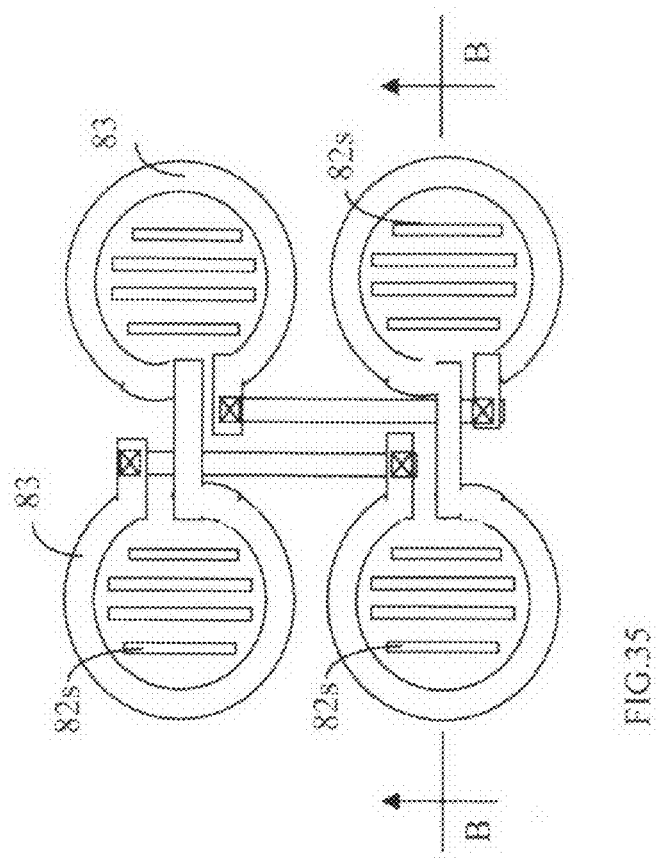
Figure 34A:
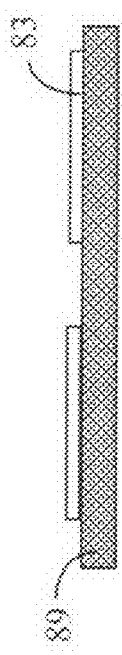
Figure 34B:
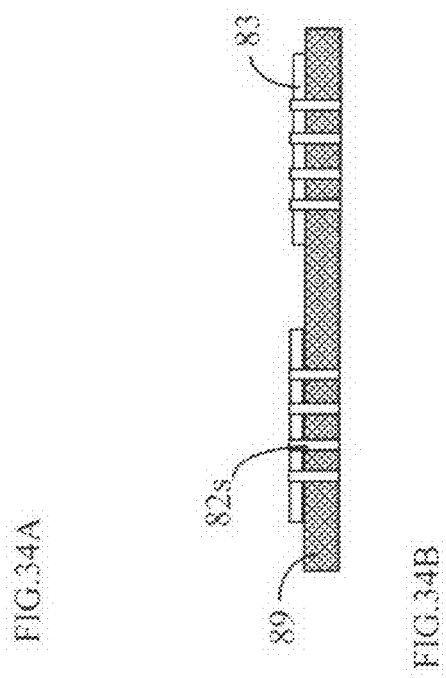

FIG. 35 is etching pattern as shown in FIG. 34B.

DESCRIPTION AND OPERATION

The on-chip inductor is the bottleneck of today technology. As shown in FIG. 1A, it shows the open magnetic field density path. All magnetic field flux is exposed directly to the external environment. The electrical-magnetic interference EMI is the magnetic field line interfering with the on-chip circuit and/or the external off-chip environment. It is a fatal problem for a precision generator such as Tales clock chip. The current 11 flows in the metal wire loop 17, the magnetic field line 12 generates and perpendicular to the plane of the metal wire loop 17. The magnetic field line 12 cuts through the other on-chip RF circuits 13 and the off-chip environment 14. It generates the on-chip RF circuit interference EMI and the off-chip environmental EMI electrical-magnetic interference.

Figure 1B:
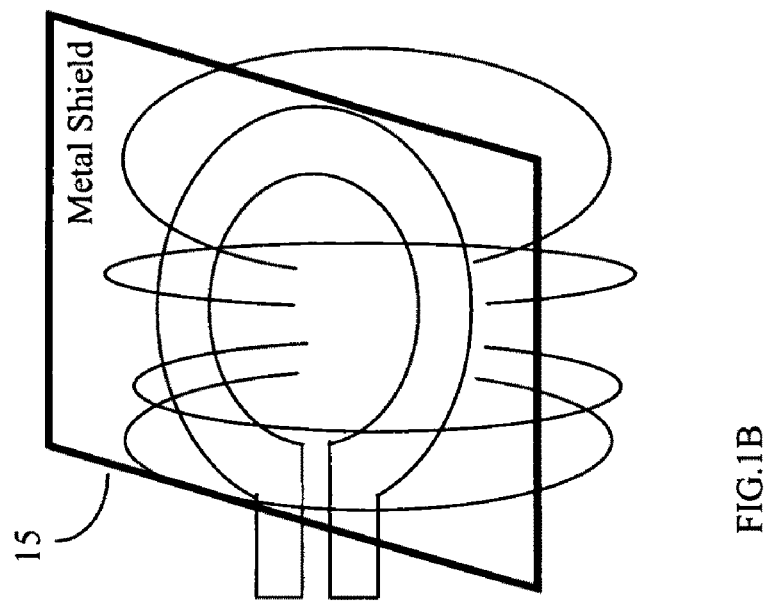
FIG. 1 is the conventional on-chip inductor; (A) the magnetic field spreads out in all the different directions; (B) the magnetic field can penetrate the shielding metal.
Figure 1A:
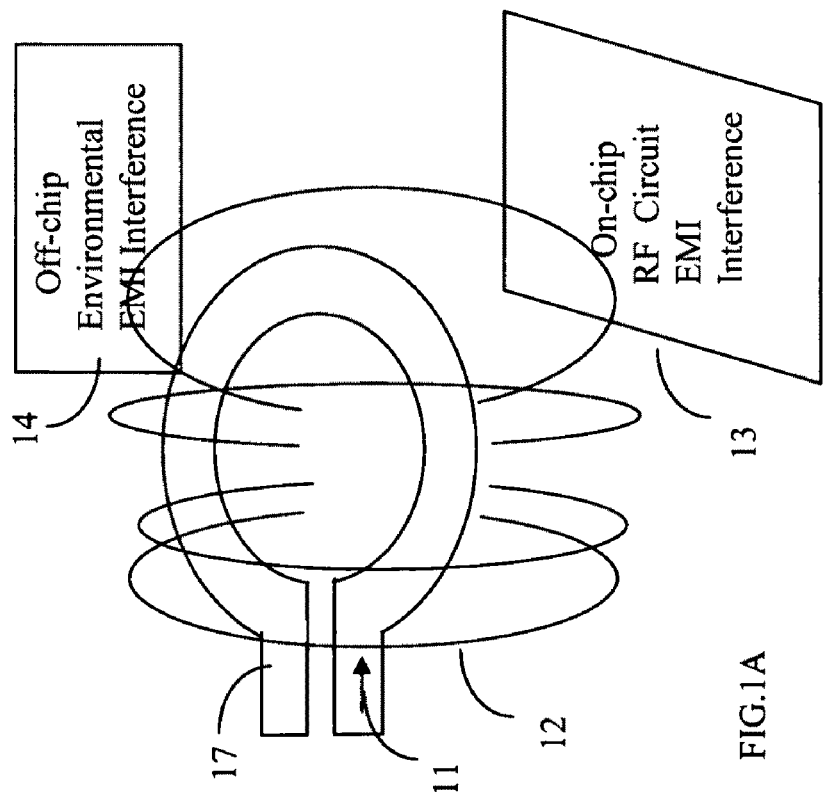

As shown in FIG. 1B, this electrical-magnetic interference EMI of the inductor magnetic field cannot be blocked with the shielding metal 15. All the magnetic field line passes through the shielding metal 15. The shielding metal only can block the electrical field. For the magnetic field line, the shield metal has no effect at all. This is the essential tough problem of the EMI-free planar inductor design. Therefore, we make the innovation on the EMI-free on-chip inductor to solve the problems of the magnetic field line interferes with the on-chip circuit and/or the external off-chip environment. As shown in FIG. 12 and FIG. 13, to address this fatal problem, our IC inductor design is a closed (shield) magnetic field density (B) path. It is the fundamental core technology of the green technology.

Figure 2:
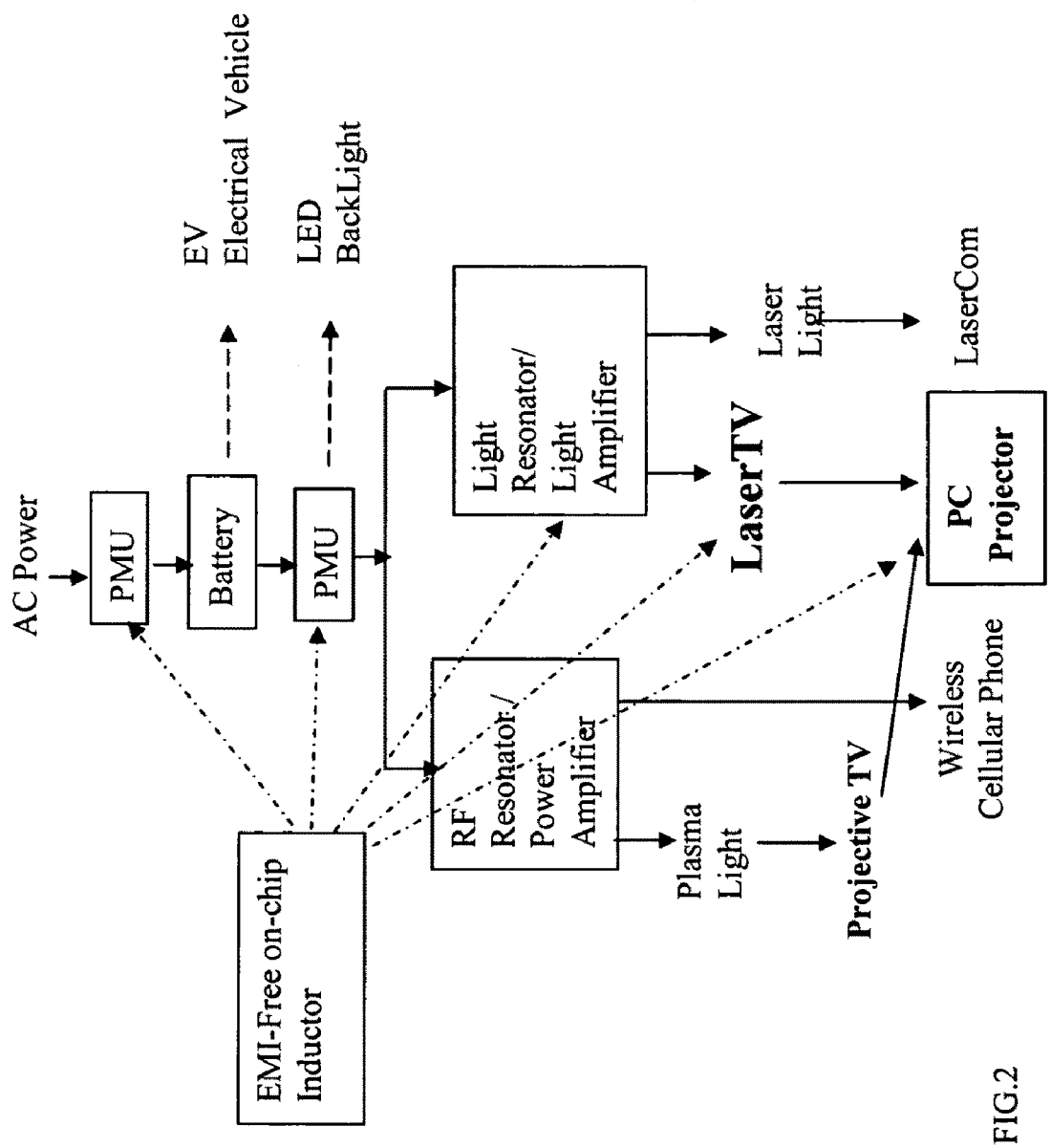
FIG. 2 is the technology development chart for the green technology including the Laser TV and PC projector.

As shown in FIG. 2, it is the development chart of the green technology. The EMI-free on-chip inductor is the core technology of the green technology. The killer applications of the EMI-free planar inductor can be applied to the power management unit PMU, Laser TV, and PC projector, etc.

Figure 10:
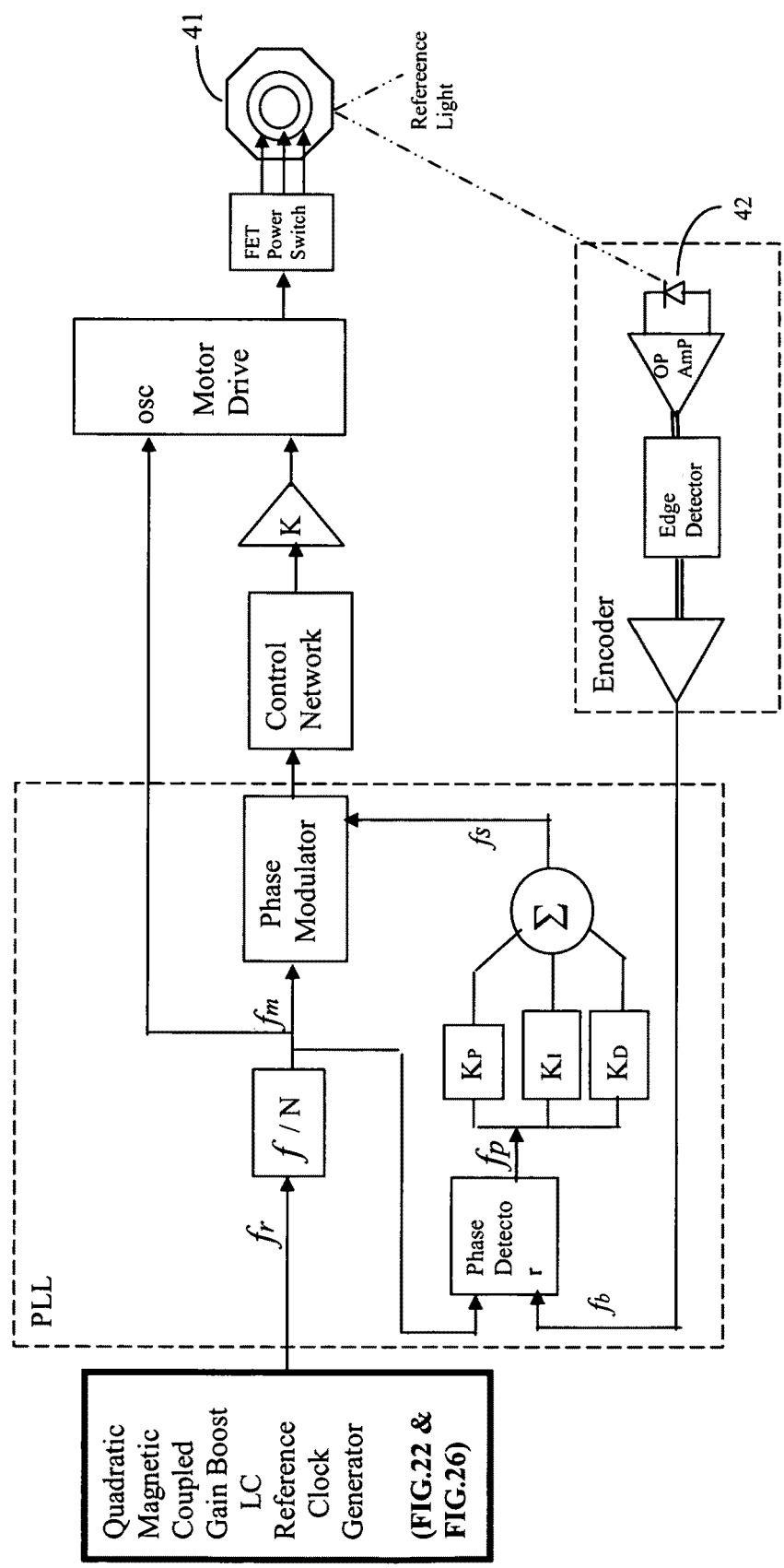
FIG. 10 is the block diagram for the control of the rotor polygon mirror being constituted of the phase Lock Look PLL and the reference clock generator having the EMI-free planar inductor.

A green technology apparatus comprises magnetic-interference-free apparatus and a plural of active devices. The active devices modulates and induces the current flowing through the magnetic-interference-free apparatus. The active devices can be a plural of switching devices. The switching devices switches on/off to induce current flowing through said magnetic-interference-free means. All the chips need the power and clock, etc. The green technology apparatus further comprises the power converter. As shown in FIG. 2 and FIG. 29, etc, the power converter comprises the switch and the magnetic-interference-free apparatus. Furthermore, the active devices can be a plural of amplifying devices. The amplifying devices modulates and induces current flowing through the magnetic-interference-free apparatus. The green technology apparatus further comprising a plural of clock. The clock comprises the magnetic-interference-free LC resonator to have specified frequencies. As shown in FIG. 2 and FIG. 10, the green technology apparatus according to claim 28 further comprising a plural of frequency synthesizer means, The frequency synthesizer comprises the magnetic-interference-free LC resonator to synthesize signal having specified frequencies.

Figure 3:
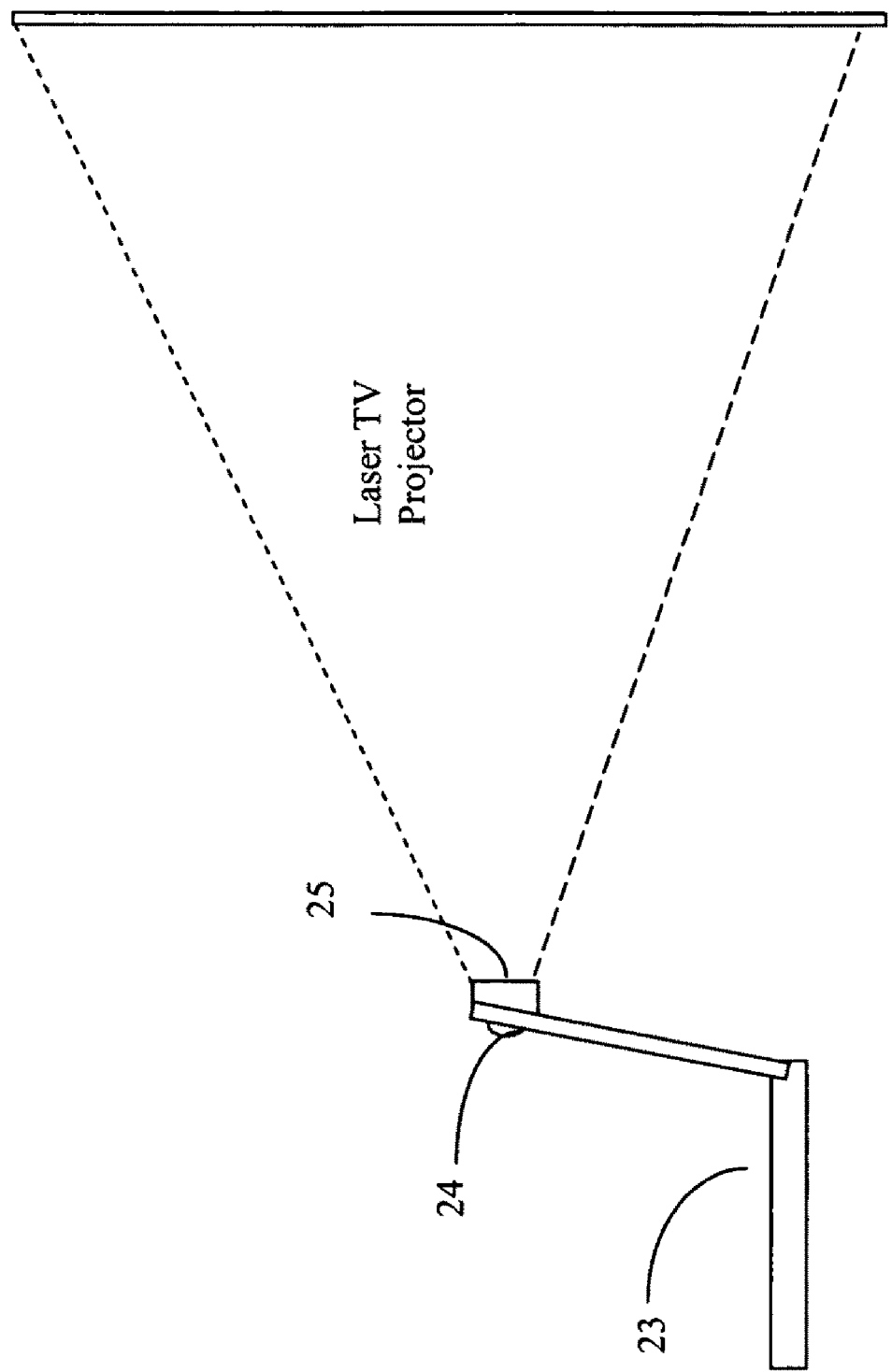
FIG. 3 is the illustrative schematic diagram to show the Laser TV applied to the notebook PC projector.

As shown in FIG. 3, the Laser TV projector 25 is mounted on the PC 23. All the PC 23 has the camera 24. In the future, all the PC has a projector 25, too.

Figure 4:
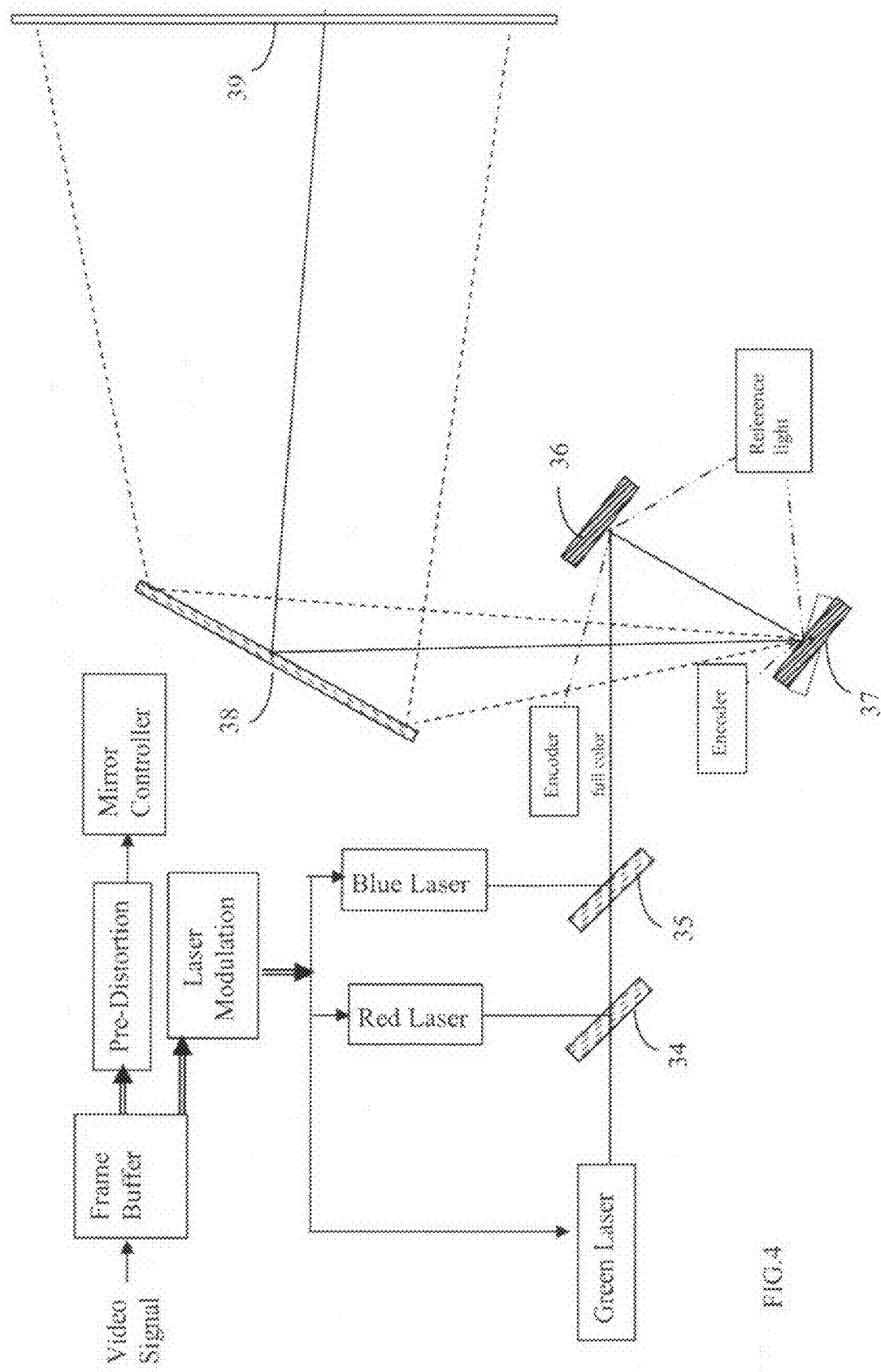
FIG. 4 is the detailed alignment of the low power compact Laser TV having the ALP analog light processor to be the scanning mirrors.
Figure 8A:
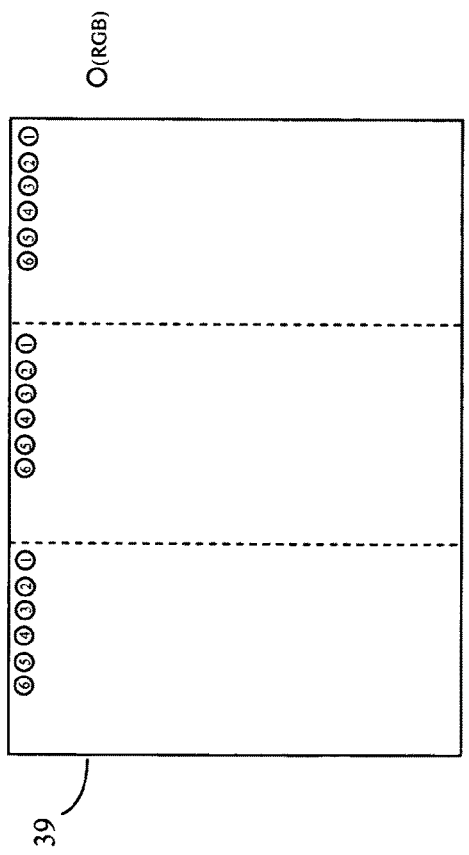
FIG. 8 (A) is the single-line multi-zone laser scanning; (B) is the multi-line multi-zone laser scanning.

The Laser TV projector has the large contrast ratio of the light. The Laser TV has the fast moving object effect than the LCD flat panel display. During the fast movement, the Laser TV has no ghost image. In the conventional TV, there are red pixel R, green pixel G and blue pixel B. The resolution of pixel is three-times less. Furthermore, the conventional TV needs the special screen to display. As shown in FIG. 4 and FIG. 8A, for the Laser TV, the RGB three color is one pixel. There is no need for the special screen. Any white wall can be the display screen. Comparing with the conventional project TV, there is no frame distortion. The scan line width can be programmed to compensate for the frame distortion.

As shown in FIG. 4, the video signal is stored in the frame buffer. Then the image data is sent to the pre-distortion to compensate for the frame distortion. According to the image data, makes the modulation for the laser light modulation. The laser modulation drives the green laser, red laser and the blue laser. The green laser light passes through the mirrors 34 and 35; the red laser reflects at mirror 34 and passes through minor 35; the blue laser light reflects at the mirror 35. The green laser light, red laser light and the blue laser light are merged together to be the full color light. The full color light shines on the horizontal scanning mirror 36, then reflects on the vertical scanning mirror 37 and projects on the screen 39. The screen 39 can be white wall.

FIG. 5 shows the scanning mirrors 36 and 37 can be implemented with the analog light processor ALP. It is well known that the digital light processor DLP can be toggled at very high speed which is much faster than the analog light processor ALP. The analog light processor ALP doesn't need the high speed as the DLP does. The analog light processor needs the accuracy. As shown in FIG. 4, the reference light shines on the scanning mirror and reflects on the encoder to have the accurate position to be encoded.

Figure 5B:
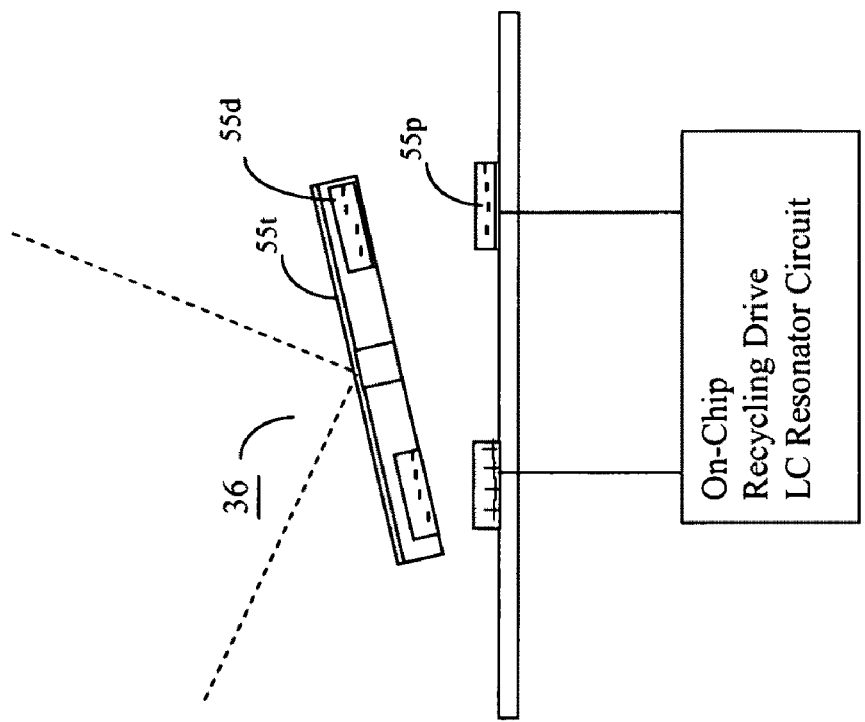
FIG. 5 is the reflective mirror of the ALP analog light processor; (A) is the single pole ALP analog light processor; (B) is the dual pole ALP analog light processor.
Figure 5A:
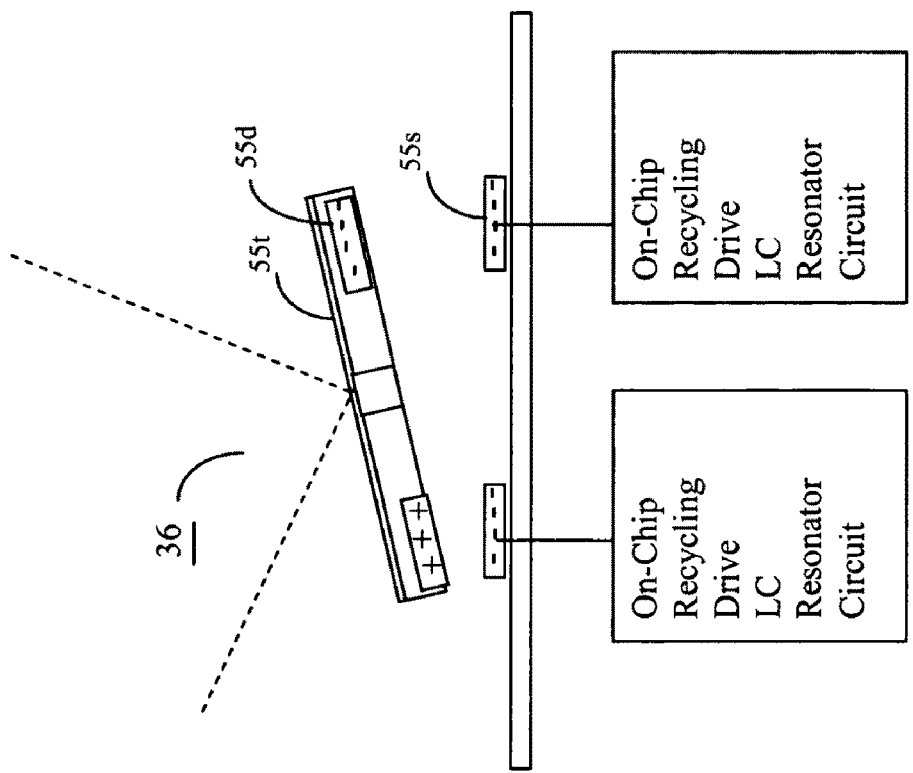

As shown in FIG. 5A, it is the single pole operation of the reflective scanning mirror. As shown in FIG. 5B, it is the dual pole operation of the reflective scanning mirror. The analog light processor ALP is active push-pull control and driving circuit. The On-Chip Recycling Drive LC Resonator Circuit can use the EMI-free planar inductor as shown in FIG. 15 to enhance the circuit performance. Before, the Recycling Drive LC Resonator Circuit needs the extra on-board inductor to implement the circuit. Now, with the on-chip EMI-free planar inductor, it can implement the Recycling Drive LC Resonator Circuit on chip.

Figure 6:
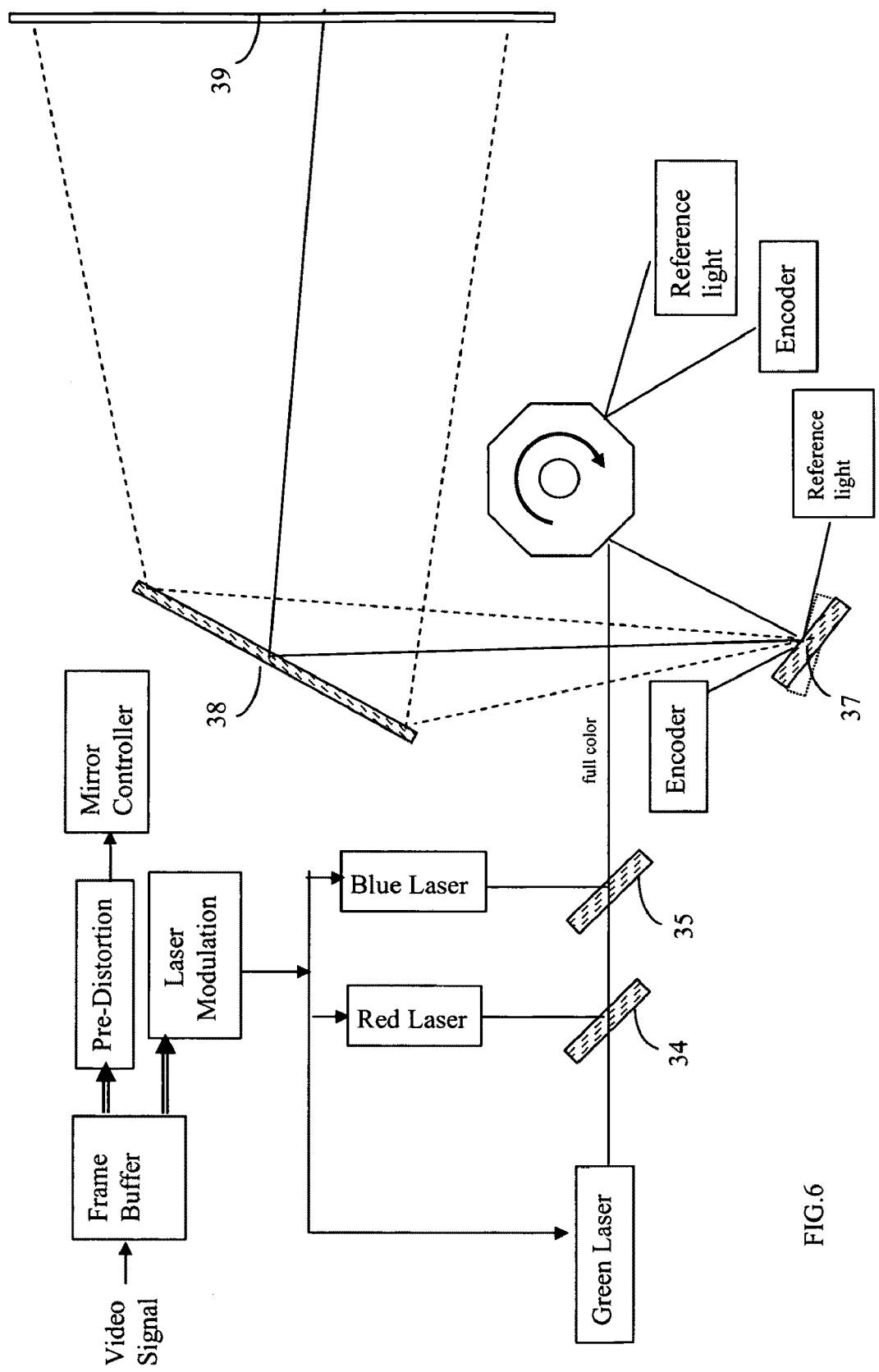
FIG. 6 is the detailed alignment of the Laser TV having the rotor scanning polygon mirror.

FIG. 6 shows the rotor type polygon mirror Laser TV system. The rotor type polygon minor Laser TV system has successfully applied to the laser printer. The rotor type polygon mirror consumes a lot of power and the size is huge. It is not suitable for the PC laser projector. However, for the green technology, as shown in FIG. 18, with the MEM type on-chip EMI-free planar inductor, the rotor type polygon mirror can be implemented on chip with small compact size.

As shown in FIG. 6 and FIG. 18, the green technology laser TV apparatus further comprises spinning motors. The spinning motor comprise a plurality of magnetic poles. The magnetic pole means is made of the magnetic-interference-free apparatus. The laser TV comprises the RGB laser to generate full color light. The laser TV comprises the accurate position encoder. The accurate position encoder comprises the magnetic-interference-free apparatus. The laser TV further comprises the scanning mirror. The scanning mirror further comprises a horizontal scanning mirror and vertical scanner. The vertical scanner is a reflective mirror. The horizontal scanning mirror is horizontal polygon mirror or reflective mirror. The laser TV is so compact that it is able to be mounted on a PC to be PC projector.

As shown in FIG. 6, the full color laser light beam hits on the polygon mirror 41 then reflects to hits on the reflective mirror 37. Both the polygon mirror 41 and the reflective mirror 37 have the optical encoder to encode the accurate positions. As shown in FIG. 8A and FIG. 6, the laser light scan from the right to left. To minimize the rotation speed, for one mirror of the polygon mirror, there are multiple light pulses. The TV screen 39 is spilt to be multiple zones. As the polygon mirror rotates, during the first mirror, the multiple dots number to be 1 encircled with a circle are shined as shown in FIG. 8A. During the second mirror, the multiple dots number to be 2 encircled with a circle are shined, etc.

Figure 7:
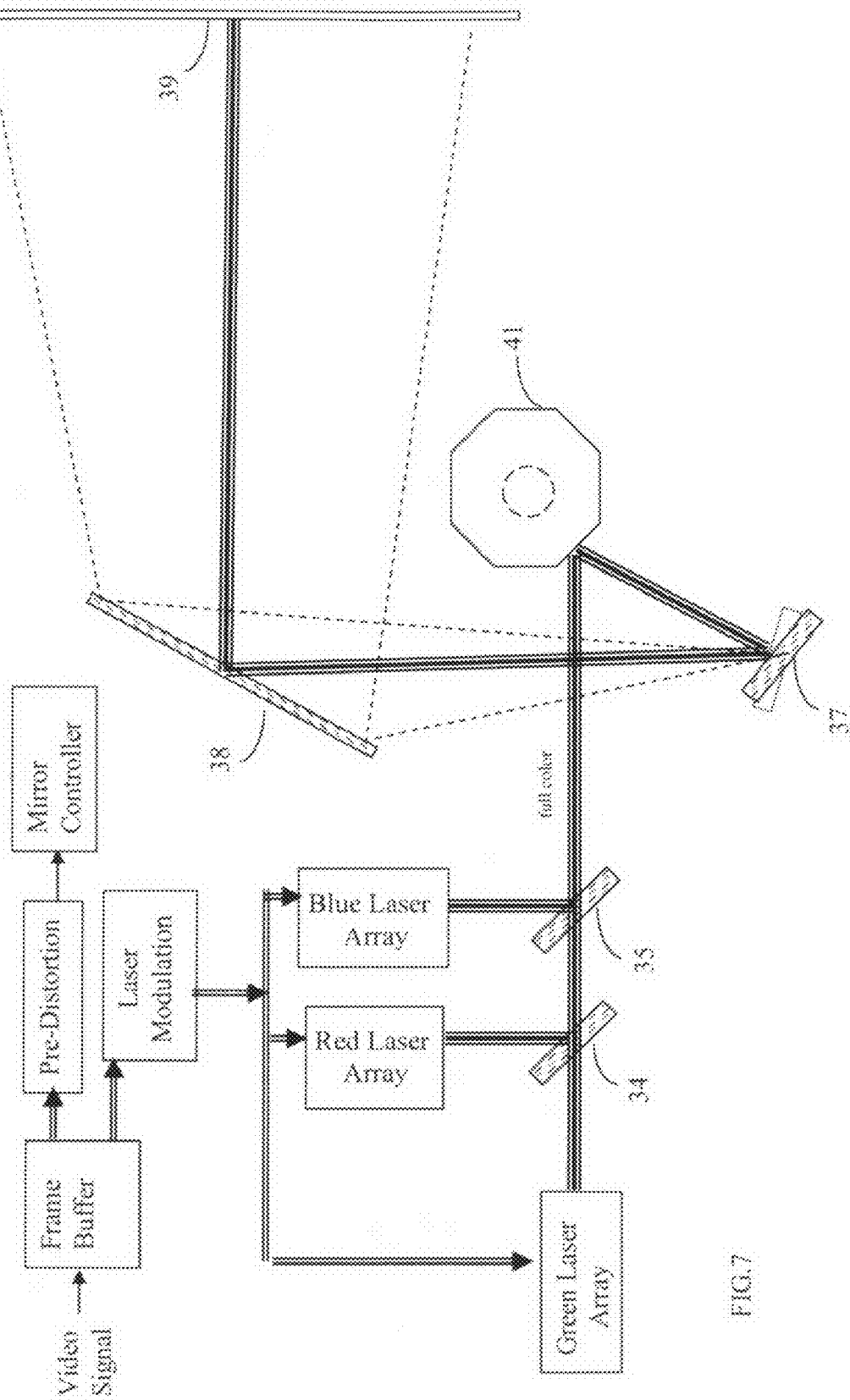
FIG. 7 is the detailed alignment of the Laser TV having the multi-line scanning laser array.
Figure 8B:
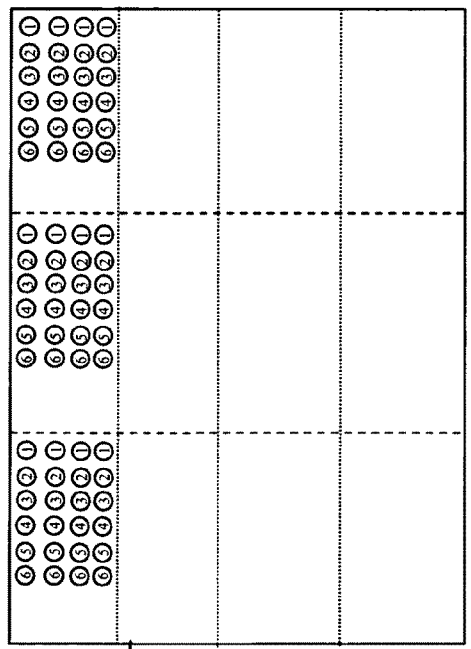

To get the high frame rate, the multiple laser array can be adopted further. As shown in FIG. 7 and FIG. 8B, the multiple lines on TV 39 are scanned once. The Green Laser Array, the Red Laser Array and the Blue Laser Array having multiple laser beams to scan the multiple rows on the TV screen 39.

Figure 9A:
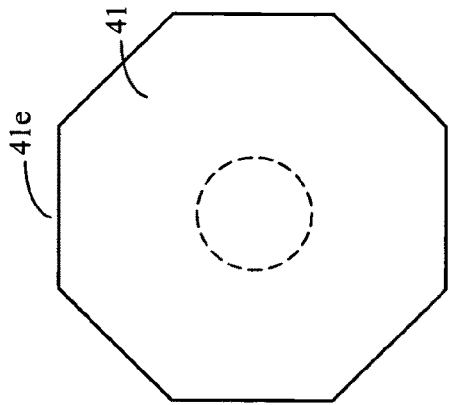
FIG. 9 (A) is the uniform angle polygon mirrors; (B) is the non-uniform angle polygon mirrors.
Figure 9B:
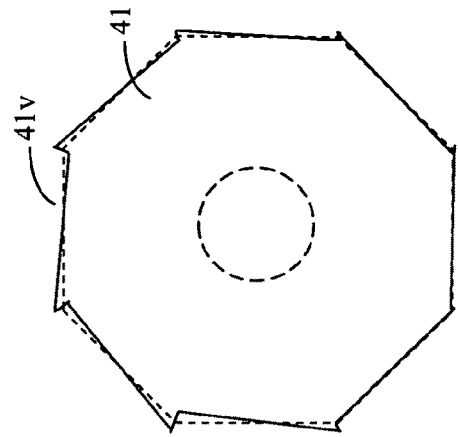

As shown in FIG. 9, there are two different polygon mirrors. FIG. 9A is the uniform polygon mirrors. FIG. 9B is the non-uniform polygon mirrors. For the uniform polygon mirror, the pulse timing increases between the successive mirror in one rotation of the mirror. For the non-uniform polygon mirror, the pulse timing is fixed between the successive mirror in one rotation of the mirror.

FIG. 10 is the block diagram for the spinning motor for the polygon mirror, To keep the accurate position there is a phase lock loop PLL comprising the most advanced cutting-edge Quadratic Magnetic Coupled Gain Boost LC Reference Clock Generator as shown in FIG. 22 and FIG. 26. The Quadratic Magnetic Coupled Gain Boost LC Reference Clock Generator. Generates the reference clock having the reference frequency fr. The reference clock fr is divided by N to be fm and sends to the oscillatory clock input osc of the motor drive controller. The reflected reference light shines on the pin diode 42 and the optical encoder generates pulses fb sending to the phase detector. The phase detector compares the fm and fb to generate the pulse fp corresponding to the phase difference. The frequency phase signal fp is sent to the proportional Kp, integral KI and differential KD blocks then summing up to be fs to have the proportional-integral-differential PID control. This is the PLL having both the PID control and the Reference Clock Generator. It is the core mechanism for the accurate position control for the polygon mirror.

Figure 11:
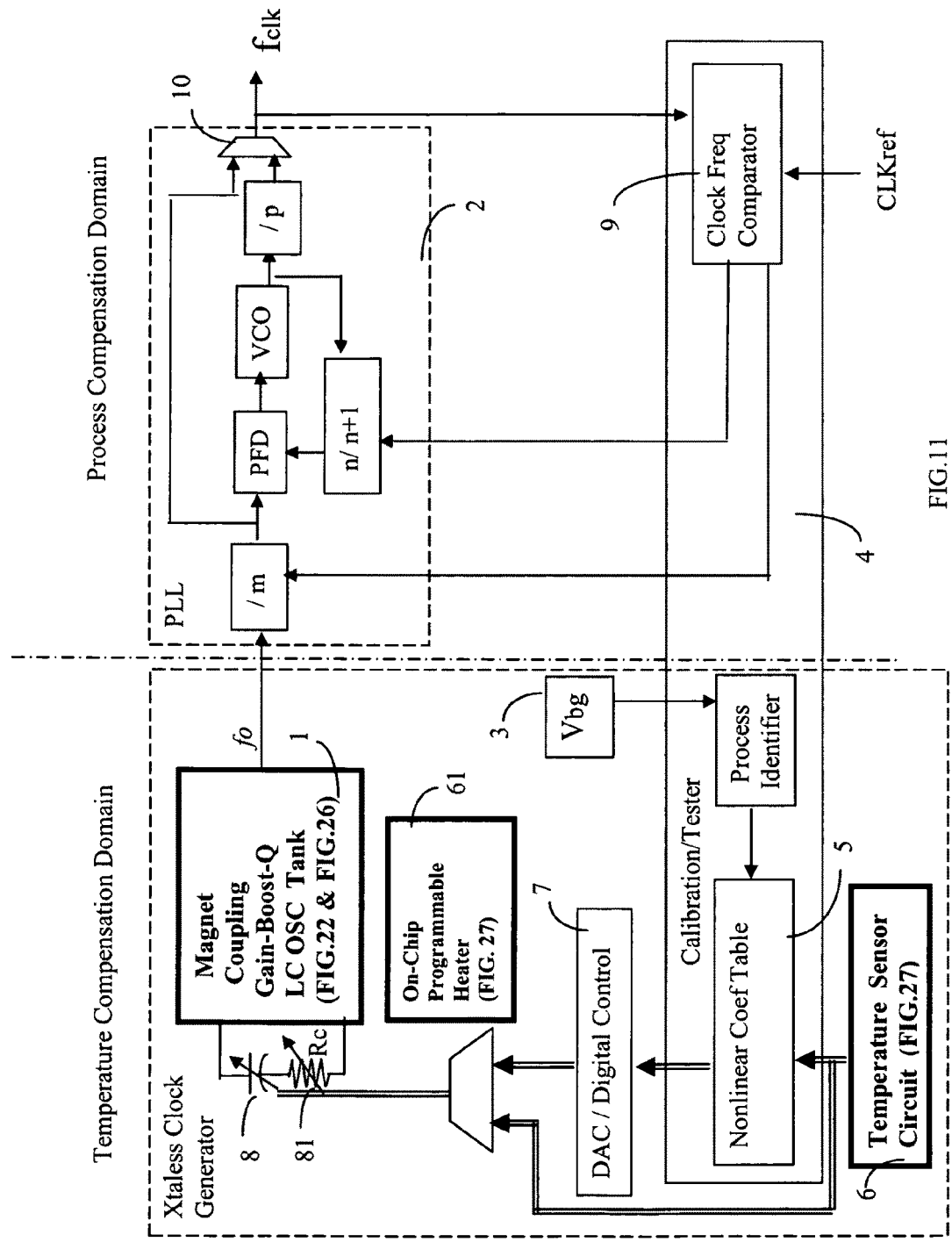
FIG. 11 is the block diagram for the phase Lock Look PLL and the reference clock generator having the EMI-free planar inductor.

FIG. 11 is the PLL and clock generator and the on-chip programmable heater 61. The PLL and clock generator can have the magnet coupling gain-boost-Q LC oscillator tank 1 made of the EMI-free planar inductor as shown in FIG. 22, etc. The tunable resistor Rc 81 is tuned to be equal to the parametric resistance of the EMI-free planar inductor in the LC tank 1. The tuning capacitor 8 is tuned to vary the oscillatory frequency. The on-chip programmable heater 61 is to change the chip temperature during the test and calibration of the xtaless clock generator. The xtalchip or the xtaless clock chip comprises of a LCO and a programmable integrated circuit heater. The LCO contains inductor, capacitor and electronic to generate a negative reactance for cancelling the parasitic resistance in inductor and capacitor. The programmable integrated circuit heater for controlling the temperature of xtalchip during the process of determines the optimum parameters means for temperature variation compensation. As a heat source to control the temperature of the DUT, a programmable current sources only utilizing during testing or TC optimizing for DUT. The Xtalchip contains LCO, programmable integrated circuit heater (PICH). The LCO contains inductor, capacitor, and inverting circuit. The inductor and capacitor connecting in parallel to be LC oscillator tank. The LC oscillator tank is connected between an input of a inverting circuit and output of another inverting circuit. The PICII is a plurality of current sources or a plurality of resistors and CMOS switches as shown in FIG. 28. During the process of determining the optimum temperature compensation parameters for the xtalchip, the PICH is for controlling the temperature of the xtalchip during the process of determining the optimum parameters temperature compensation.

As shown in FIG. 12 and FIG. 13, BP is the magnetic field being parallel to the chip surface 82. EMI-free planar inductor is the on-chip inductor having the magnetic field being confined in a thin volume space to be B// to eliminate the electrical and magnetic filed interference effects. As shown in FIG. 12, it is the horizontal-loop type EMI-free planar inductor. As shown in FIG. 13, it is the vertical-loop type EMI-free planar inductor. They are conjugate in layout view. The performance of the vertical-loop type EMI-free planar inductor is much better than the horizontal-loop type EMI-free planar inductor. It is the fundamental breakthrough in the EMI-free on-chip inductor.

The EMI-Free inductor has magnetic confinement and magnetic shielding for the magnetic interference of external environment, internal circuit and itself. As the magnetic is confined, it naturally has the magnetic shield effect to the outside environment. To reduce the cost, the confinement closure can be reduced to be partial closure, too. As shown in FIG. 12A, the magnetic field B// is in parallel to the chip surface 88. As shown in FIG. 12B, the implementation of the magnetic field B// is the coil confinement 33 and the core confinement 22. The core confinement 22 is made of the magnetic material which has high magnetic conductivity. FIG. 12C shows the section view of the horizontal loop of the EMI-free planar inductor.

The green technology of EMI-free inductor comprises the magnetic-interference-free inductor. The magnetic-interference-free inductor is constituted of the magnetic-interference-free apparatus and inductor. The magnetic-interference-free apparatus guides and confines the magnetic field inside it to have magnetic shield for outside environment and eliminates the magnetic interference to internal circuit. The magnet field can only use the guide with the magnet material. There is no material can shield the magnetic field. As shown in FIG. 13A, the magnetic field B// is in parallel to the chip surface 88. There is only one sheet of magnetic material such as non-metal sub-magnetic above the surface plane serving as the magnetic shielding. As shown in FIG. 13B, the implementation of the planar inductor magnetic field B// is the coil confinement 83 and the core confinement 82. The magnetic-interference-free apparatus guides and confines the magnetic field in the magnetic-interference-free apparatus in parallel to a surface plane to have magnetic shielding effect for outside environment and eliminate magnetic interference to internal circuit means. The B// is confined with the magnetic conductivity of the magnetic core. To turn the magnetic field B//, the coil 83 changes the magnetic field B// direction. The core confinement 82 is made of the magnetic material which has high magnetic conductivity.

The magnetic-interference-free apparatus comprises the electric coil confinement apparatus and the core magnetic confinement apparatus. The electric coil confinement apparatus is a plurality of electric current conductive loops being parallel to a surface. The core magnetic confinement is made of magnetic material covering on a plurality of electric current conductive loops and making magnetic field flux connection of a plurality of electric current conductive loops. The core magnetic confinement guides and confines the magnetic field flux generated by a plurality of electric current conductive loops to be magnetic loop. FIG. 13C shows the section view of the vertical loop of the versatile EMI-free planar inductor. FIG. 13C1 is the complete magnetic loop being made of the magnetic core material. It has the superior magnetic conductivity and the superior Q factor. FIG. 13C2 is the magnetic loop having the vertical gaps. There is no vertical segment of the magnetic coil. FIG. 13C3 is the magnetic loop having the vertical gaps and bottom horizontal gap. There is no vertical segment and bottom horizontal segment of the magnetic coil. There is only one sheet of magnetic material such as non-metal sub-magnetic above the surface plane serving as the magnetic shielding. These designs in FIG. 13C are to show the EMI-free planar inductor having only conjugate two loops. This concept is applicable to any number of planar inductor even one as shown in FIG. 14.

To provide EMI-free planar inductor of a closed magnetic field flux IC inductor (CMFFICI), the core material must be magnetic material. The magnetic material can be soft magnetic material, non-metal sub-magnetic material, etc. More specially, it should be soft magnetic material such as Silicon-iron, Mu metal (5Cu, 2Er, 77Ni) and supermalloy (79 Ni, 5Mo).

There is another benefit of our CMFFCI is the relative permeability is much bigger than 1. The permeability of all prior art IC designs is about 1. Supermalloy (79Ni, 5Mo) has the relative permeability of $10^{}6$; silicon-Iron(3) has the relative permeability of ($10^{}5$). This would make our EMI-free planar inductor of CMFFICI has a super high Q inductor with a minimal silicon areas. This Q of the EMI-free planar inductor of CMFFICI is compatible to the Q of crystal oscillator performance.

It is noted that the definition of the Q is $$Q=\omega(\text{Energy stored in inductor/Energy dissipated})$$

As the relative permeability increases from one to be $10^{}6$, the Q of the planar inductor will increase from 10 to $10^{}7$ which is comparable and even better than the Q of crystal.

There are versatile EMI-free planar inductors. FIG. 14 shows the single loop EMI-free planar inductor. The single loop can have many turns of the wire wounding. Here we just draw one turn to represent the single loop. As shown in FIG. 14A is the top view of the single loop EMI-free planar inductor. To show the detail of the single loop of the EMI-free planar inductor, in FIG. 14B, we remove the core confinement 82 from the single loop EMI-free planar inductor.

As shown in FIG. 14B1 is the magnetic field B pointing downward single loop. The current I flows in the counterclockwise direction. FIG. 14C1C is the circuit symbol of the magnetic field pointing upward EMI-free planar inductor. FIG. 14C1L is the layout and circuit symbol of the magnetic field pointing upward EMI-free planar inductor. The dot symbol represents the magnetic field pointing upward.

As shown in FIG. 14B2 is the magnetic field B pointing downward single loop. The current I flows in the clockwise direction. FIG. C2C is the circuit symbol of the magnetic field pointing downward EMI-free planar inductor. FIG. C2L is the layout and circuit symbol of the magnetic field pointing downward EMI-free planar inductor. The cross symbol represents the magnetic field pointing downward.

FIG. 15 shows the dual loop EMI-free planar inductor. It can have multiple turns wire wounding. Here we just show one turn of wire wounding. As shown in FIG. 15A is the top view of the dual loop EMI-free planar inductor. To show the detailed structure of the dual loop EMI-free planar inductor, the core confinement 82 is removed.

As shown in FIG. 15B is the dual loop wiring structure. One loop is clockwise and the magnetic field points downward. Another loop is counterclockwise and the magnetic field points upward. The wire loop 83 is a continuous wiring with the contact 83c to change the layers. The core confinement might be any of the three kind shown as in FIG. 13C. FIG. 15C1 is the circuit symbol of the dual loop EMI-free planar inductor. FIG. 15C2 is the layout and circuit symbol of the dual loop EMI-free planar inductor. In the symbols, there are two inductors having the cross and dot marked at the ends of the inductors. There are wire connected between the cross and dot. It means there is the magnetic couple between these inductors.

It is noted that the number loops can be increased with the similar way. The shape of the loop can be square, rectangle or polygon to have much more compact layout area for high magnetic field density.

The magnetic-interference-free apparatus is a plural of loops. A plural of coil confinement is embedded in a plural of loops having the magnetic field pointing upward and downward alternatively. The coil confinement is conducting in the magnetic field in a vertical loop. The magnetic-interference-free apparatus comprises an electric coil confinement apparatus and the core magnetic confinement apparatus. The electric coil confinement apparatus is a plurality of electric current conductive loops apparatus being parallel to a surface. The core magnetic confinement apparatus is made of magnetic material covering on a plurality of electric current conductive loops and making magnetic field flux connection of center portions of a plurality of electric current conductive loops. The core magnetic confinement guides and confines the magnetic field flux generated by a plurality of electric current conductive loops to be magnetic loop. FIG. 16 shows the quadratic loop EMI-free planar inductor. As shown in FIG. 16A is the top view of the quadratic loop EMI-free planar inductor. To show the detailed structure of the qua-dratic loop EMI-free planar inductor, the core confinement 82 is removed. As shown in FIG. 16B is the quadratic loop. The magnetic field B points upward and downward alternatively to be the consecutive magnetic loop. The current loops are in clockwise and counterclockwise alternatively. FIG. 16C1 is the circuit symbol of the quadratic loop EMI-free planar inductor. FIG. 16C2 is the layout and circuit symbol of the quadratic loop EMI-free planar inductor. The cross and dot are connected alternatively to represent the magnetic cou-pling of the quadratic loop EMI-free planar inductor.

The magnetic-interference-free apparatus guides and con-fines the magnetic field in a plane in parallel to a surface plane in the magnetic-interference-free apparatus in parallel to a surface to have magnetic shielding for outside environment and eliminate magnetic interference to internal circuit means. FIG. 17 shows the conjugate loop EMI-free planar inductor. The conjugate loop doesn't have the electrical continuous connectivity. The inputs Vo1+ and Vo1− are not connected to the inputs Vo2+ and Vo2− directly. However, the conjugate loop has the magnetic coupling. It is corresponding the on-chip plane transformer.

As shown in FIG. 17A, it is the top view of the conjugate loop EMI-free planar inductor. To show the detailed structure of the quadratic loop EMI-free planar inductor, the core con-finement 82 is removed. As shown in FIG. 17B, it is the conjugate loops. FIG. 17C1 is the circuit symbol of the con-jugate loop EMI-free planar inductor. FIG. 17C2 is the layout and circuit symbol of the conjugate loop EMI-free planar inductor. The connection between the cross and dot is the magnetic coupling. The magnetic coupling EMI-free planar inductor has the very important applications (1) for the high Q LC resonator as shown in FIG. 22; and (2) for the boost-buck converter switch mode power supply as shown in SMPS FIG. 30.

FIG. 18 shows the EMI-free planar inductor has the impor-tant application in the MEM to build the multi-phase brush-less DC motor. As shown in FIG. 18A, the top core confine-ments 92 have the gap between them that the magnetic field is exposed. The spinner 90 is located at the center of the multi-phase ENI-free Inductors.

The EMI-free planar inductor has a lot of application such as filter, PLL, etc. It can further comprise the active devices. The active devices modulates and induces the current flowing through said magnetic-interference-free means. The filter comprises inductors. The inductor can be EMI-free planar inductor. The phase lock loop PLL comprises VCO. The VCO can be LC oscillator. The LC oscillator comprises inductor and capacitor. The inductor can be EMI-free planar inductor.

FIG. 19 is the EMI-free planar inductor applied in the constant common-mode and constant amplitude control gain-boost-Q LC resonator. Furthermore, as shown in FIG. 27D, the varactor capacitance is dependent on the common mode voltage. If the common mode voltage is wandering, the oscil-latory frequency is wandering, too. That is a reason why we need the common mode control. The LCO comprises of an integrated circuit inductor. The inductor has the centering magnetic field flux been guided by a magnetic field material. The magnet field material had better to be a soft magnetic material. The magnetic material can be Si—Fe. The elec-tronic circuit is back-to-back connection inverters.

The magnetic-interference-free LC resonator comprises the magnetic-interference-free inductor and capacitor. The magnetic-interference-free inductor comprises magnetic-in-terference-free apparatus and inductor. The magnetic-inter-ference-free apparatus guides and confines the magnetic field in the magnetic-interference-free apparatus to have the mag-netic shield for outside environment and eliminate magnetic interference to internal circuit means. The inductor means having the $1^{st}$ terminal connected with a $1^{st}$ terminal of the capacitors and the inductor having the $2^{nd}$ terminal connected with the $2^{nd}$ terminal of the capacitors to form an oscillating resonator. As shown by the thick line drawing in FIG. 19, the Pcmam Controller module, the Vcmam Controller module and the Pcmam Vcmam Gen module are the alternative design of the common mode and amplitude mode control. The alternative design is to have the common mode, ampli-tude mode control and active noise reject circuit merge together. Originally, the Vcmam Controller is the noise reject-ing circuit to keep gcom to be equal to Vcmam; the Pcmam Controller is the noise rejecting circuit to keep vcom to be equal to Pcmam. Now the voltages Pcmam and Vcmam are no more constant. They are the function of the Vrefapo, Vcmo, Vo+ and Vo−. We can adjust the Pcmam and Vcmam to have the (Vo+−Vo−)=Vrefapo∼(Pcmam−Vcmam)

and (Vo++Vo−)/2=Vrefcmo∼(Pcmam+Vcmam)

This control architecture is much more efficient and has the multi-function of the anti-noise. The gain-boost-Q common mode and amplitude mode control effect will be much better. If the MOS device uses the deep N-well and P-well to decouple the noise coupling from the substrate, the oscillator performance will be much better.

FIG. 20 is the EMI-free planar inductor applied in the constant peak and constant valley control gain-boost-Q LC resonator. The magnetic-interference-free LC resonator com-prises the magnetic-interference-free inductor and capaci-tors. The magnetic-interference-free inductor further com-prises magnetic-interference-free apparatus and inductor. The magnetic-interference-free apparatus guides and con-fines magnetic field in the magnetic-interference-free appa-ratus to have magnetic shield for outside environment and eliminate magnetic interference to internal circuit means. The inductor has the $1^{st}$ terminal connected with the $1^{st}$ terminal of the capacitors and the inductor has the $2^{nd}$ terminal connected with the $2^{nd}$ terminal of said capacitors to form an oscillating resonator. As shown by the thick line drawing in FIG. 20, the Pmxmn Controller module, the Vmxmn Controller module and the Pmxmn Vmxmn Gen module are the alternative design of the common mode and amplitude mode control. The alternative design is to have the common mode, ampli-tude mode control and active noise reject circuit merge together. Originally, the Vmxmn Controller is the noise rejecting circuit to keep gcom to be equal to Vmxmn; the Pmxmn Controller is the noise rejecting circuit to keep vcom to be equal to Pmxmn. Now the voltages Pmxmn and Vmxmn are no more constant. They are the function of the Vrefmax, Vrefmin, Vo+ and Vo−. We can adjust the Pmxmn and Vmxmn to have the Vo+,max=Vo−,max=Vrefmax∼Pmxmn and Vo+,min=Vo−,min=Vrefmin∼Vmxmn This control architecture is much more efficient and has the multi-function of the anti-noise. The gain-boost-Q common mode and amplitude mode control effect will be much better. If the MOS device uses the deep N-well and deep P-well to decouple the noise coupling from the substrate, the oscillator performance will be much better.

The alternative design of the common-mode, amplitude mode control, the maximum mode and minimum mode can be applied to resonators in the following figures, too.

FIG. 21 is the EMI-free planar inductor applied in the quadratic oscillator being made of the constant common-mode and constant amplitude control gain-boost-Q LC resonator and the constant peak and constant valley control gain-boost-Q LC resonator.

The magnetic-interference-free LC resonator further comprises the amplitude control and common mode control. The active device generates the negative reactance to pumping energy into said LC resonator to sustain oscillation. The amplitude control measures the output of the LC oscillator to keep amplitude of the output of the LC oscillator to follow target values. The common mode control measures the output of the LC oscillator to keep the common mode voltage of the output of LC oscillator to be a target value. FIG. 22 is the EMI-free planar inductor applied in the conjugate oscillator being made of the constant common-mode and constant amplitude control gain-boost-Q LC resonator and the constant peak and constant valley control gain-boost-Q LC resonator. Both LCO oscillator have the same clock in phase. The LCO comprises a plurality of IC inductor having a plurality of soft magnet material to provide a closed loop path for the centering magnet field flux. There is no electrical signal feedback and it has only the magnetic coupling.

FIG. 23 is the N-type LC resonator having the constant amplitude control only. The Vreg_cmc Generator supplies the Vcmc common mode supply voltage. FIG. 24 is the P-type LC resonator having the constant amplitude control only. The Vreg_cmc Generator supplies the gcmc common mode supply voltage. FIG. 25 is the Vreg_cmc Generator supplies both the Vcmc common mode supply voltage and the gcmc common mode supply voltage to the gm LC core. The EMI-free planar inductor is applied to the LC resonator. The electronic circuit generates a negative reactance to cancel the parametric resistance of the inductors and capacitor. The magnetic field material is a soft magnetic material such as SiFe.

It is also well known that the oscillatory frequency of the LCO decreases, the amplitude of the LCO tank increasing. There the temperature compensation could be achieved by modulating the modulating the amplitude reduces to correlated with the temperature of the dice(chip). Our dual controls (amplitude and common mode) LCO could be correct to have zero TC by controlling the TC of the amplitude reference or by controlling the TC of the common mode reference. It is desirable to keep the common mode voltage to be fixed. FIG. 26 is the gain-boost-Q LC resonator having the temperature compensation.

As shown in FIG. 26, the xtaless clock chip circuit containing a LCO. The oscillation outputs vo+ and vo− of gm LC core are sent to the Common Mode Control (CMC) and Amplitude Control (AMC). The LCO has capacitor and a plurality of inductors of which centering magnetic field fluxes guided by a magnetic field material. The xtalchip contains a LCO and a programmable integrated circuit heater (PICH), LCO contains inductor, capacitor and electronic circuits to generate a negative reactance to cancel the parasitic resistances of said inductor and capacitor. PICH is for controlling temperature of Xtalchip only during the process of determining the optimum controlling parameters for temperature compensation circuits. PICH is a plurality of circuit sources or plurality of resistors and electronic switches.

Figure 26A:
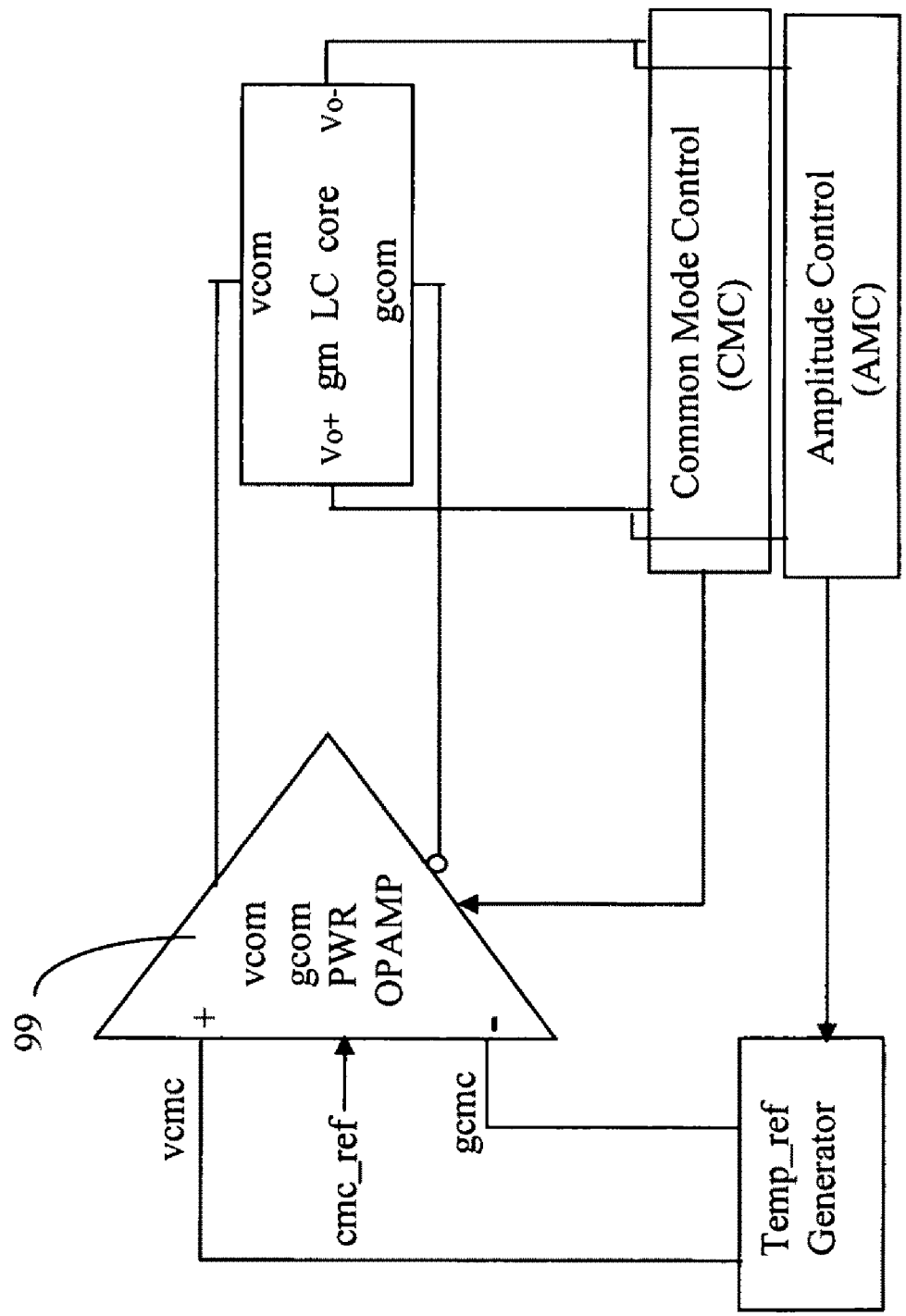

As shown in FIG. 26B, the Common Mode and the Amplitude Voltage are generated from the peak voltage and the valley voltage. The Temp_ref Generator generates the vcmc and gcmc voltage sending to the vcom gcom PWROPAMP 99. The system and architecture as shown in FIG. 26A has the adaptive optimization for the minimization of the phase noise. The LCO comprises of TC Temperature compensation process. As shown in FIG. 26D1, the adaptive control for the minimum phase noise of the noiseless gain-boost-Q LC resonator is at the boundary of the voltage mode control of the LC resonator and the current mode control of the LC resonator. The common mode and amplitude control will automatically operate at the amplitude having the minimum phase noise. Furthermore, as shown in FIG. 26D2, the frequency of the adaptive the noiseless gain-boost-Q LC resonator is function of the amplitude. The amplitude is fixed that the frequency is also to be fixed to be the jitterless/spurfree control for the high-gain-boost LC resonator.

The temperature changes the oscillatory frequency of the LC tank. Therefore, it is required to have a temperature compensation circuit for the LCO. As shown in FIG. 11 and FIG. 27, after we make the $R_L = R_C$ to compensate the frequency change due to temperature variation of the inductor parametric resistance $R_L$, we still need to have the temperature parametric capacitance of Mp1, Mp2, Mn1 and Mn2. However, the EMI-free planar inductor has big Q. Therefore, the LCO needs less current. The MOS devices Mp1, Mp2, Mn1 and Mn2 are smaller. The parametric capacitance of Mp1, Mp2, Mn1 and Mn2 are smaller. It causes the less nonlinearity due to the temperature variation. The LCO performance will be much better.

It is well known that the frequency of the LCO is proportional to $1/(LC)^{**}\frac{1}{2}$. It is difficult to modulate the inductor L with a fine resolution. Therefore, the varactor is essential to be part of the LC tank to compensate the temperature variation. All prior-art utilizes single end voltage control signal to control the varactor of the LC tank. This single end feature is subjective to the noise problems. It makes the frequency of the LC tank to wander and create clock jitter.

Figure 27A:
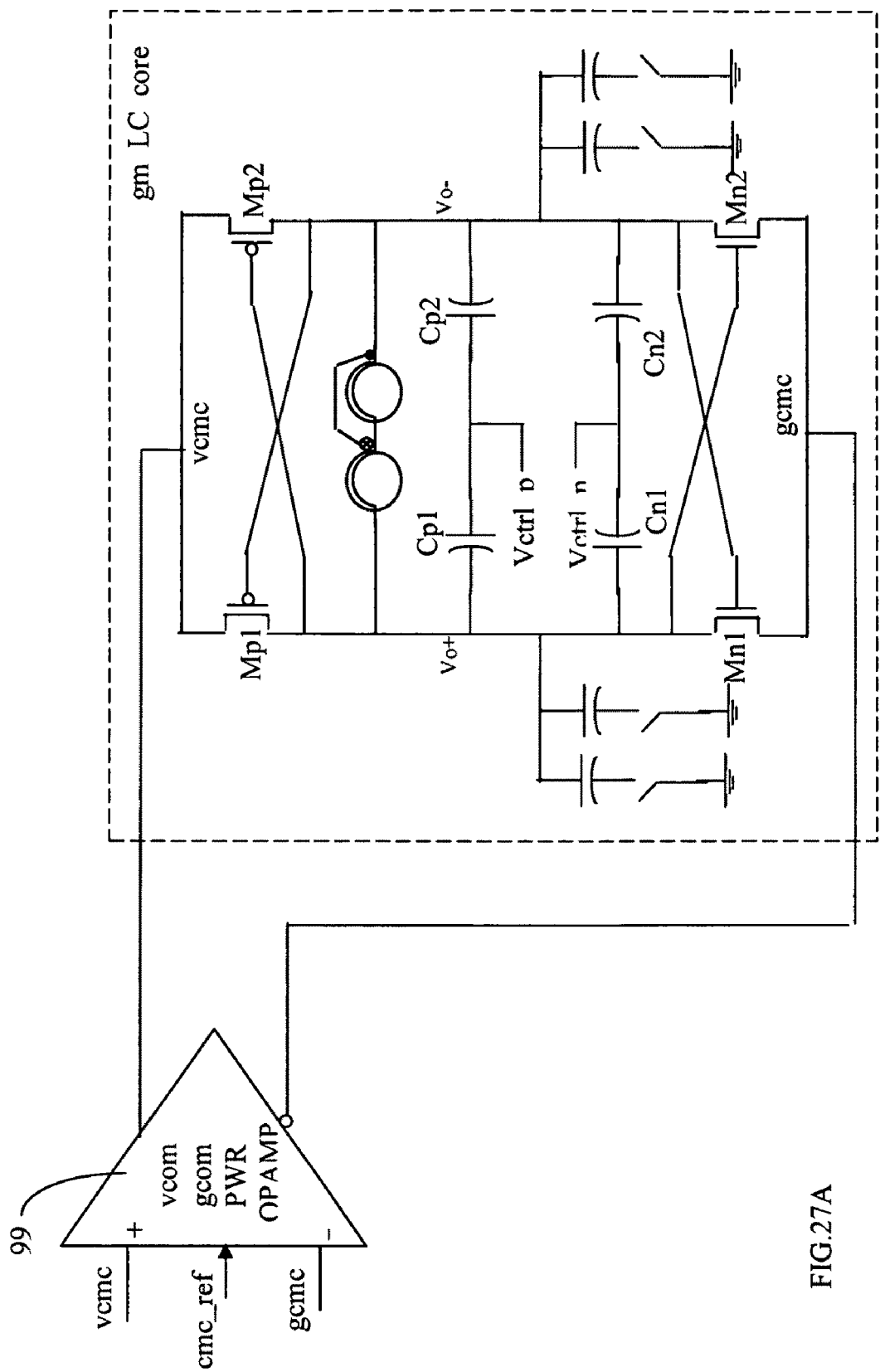

As shown in FIG. 27, our new LCO has a differential control voltage architecture. The varactor is connected in a topology to receive the differential voltage control signal means to change their capacitance. The differential voltage signal is proportional and inverting proportional to temperature variation. FIG. 27A is the differential control voltage for the varactor. FIG. 27B is the temperature compensation circuit for the differential control voltage for the varactor. It is the test and calibration system for the temperature compensation. FIG. 27C1 is the differential variable capacitance made of the diode. FIG. 27C2 is the differential variable capacitance made of the varactor. The differential voltage control signals are for the high performance Xtal Chip and Xtaless Clock Chip. The common mode noise is neutralized by the differential voltage control topology. Furthermore, as shown in FIG. 27D, the characteristics curve of the varactor shows the differential compensation in the variation of the output voltage Vo.

$$(Cpv1+Cpv2)+(Cnv1+Cnv2)=Cp+Cn=Cv,\text{total}$$

Due to the differential compensation, even the common mode change, the total capacitance of the varactors Cv,total is constant over the common mode variation. The common mode adjust of the capacitance is independent of the variation of output voltage swings.

For the TC Temperature compensation process, to determine a correction of temperature compensation, conventional prior art design using at least two test temperature to determine the correct temperature compensation for the LCO. The conventional process is expensive and slow.

To minimize the test and calibration, we need the on-chip burner capability. Without changing the temperature of the burner, we can adjust the on-chip temperature to make the calibration of the temperature compensation and store the calibration value in the flash memory on the chip.

To address this testing issue, a mean to determine the DUT temperature is from the power coefficient of the DUT. Our design adds an programmable IC heater in the xtalchip or the Tales ClockChip. During test, we can set the temperature of the DUT (Device Under Test) by controlling the current providing to an IC heater. The IC temperature determined by formula below $$Tj = T_{am} + V*I*M_T$$

$T_{am}$: ambient temperature
V: Voltage level of power supply
I: Current of Power supply or Injecting Power
$M_T$: Thermal Resistance The LC resonator providing clock timing signal having temperature coefficient to be minimized that the LC resonator further comprising a programmable integrated circuit heater. The programmable integrated circuit heater injects thermal power to integrated circuit. During testing process to determine temperature coefficient of said LC resonator to determine temperature compensation parameters, from the injected thermal power, thermal resistance of said chip and environmental temperature, the on-chip temperature of the chip is calculated. The programmable integrated circuit heater means can be a plurality of resistors and switch or a plurality of current source means and a plurality of switch mean.

Due to its programmable IC heater, we can set the DUT at multiple on-chip temperature to correct the nonlinearity. This IC heater is only use during testing. To vary the on-chip temperature, as shown in FIG. 28A, it is the on-chip heater for the test of chip. As shown in FIG. 28B, it is the heater with variable resistance array. The LCO comprises of a bank of resistors and switch transistors utilizing as a programmable heat source to set the temperature of the Device Under Test DUT during test or Tc optimized for DUT. The programmable integrated circuit heater is a plurality of resistor and electronic switches. The resistor can be the binary weighted resistance. FIG. 28C1 is the heater with various current source array. The current source can be the binary weighted current source. The programmable integrated circuit heater means is a plurality of current sources to generate heat. FIG. 28J2 is the implementation of the heater with the various current source array being implemented with the PMOS devices. The PMOS devices have the binary weighted (W/L) ratios.

Figures 29A, 29B:
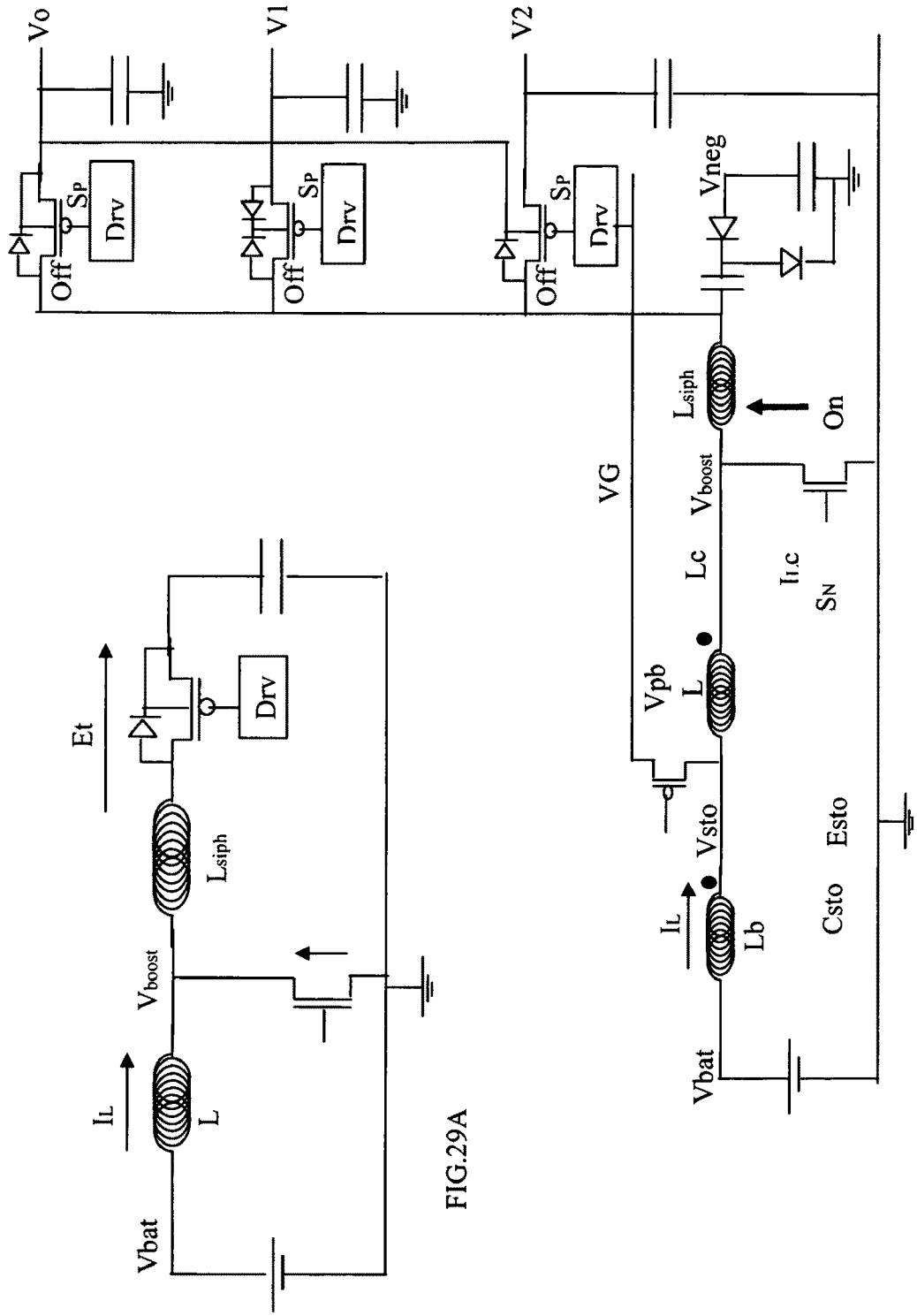

Furthermore, the active devices can be a plural of switching devices. The switching devices switches on/off to induce current flowing through the magnetic-interference-free means. To have the voltage regulator for the LC resonator, FIG. 29 shows the versatile high power efficiency boost-buck converter. Almost all the chip comprises the LC resonator and power converter. The power converter comprises the switch and magnetic-interference-free apparatus. It might consider be to be the cascade of the boost converter and buck converter. The boost converter boosts up the voltage then the buck converter converts to the specified output voltage. The boost converter has the switch loss at the boost node. However, the buck converter has the siphon capability to sip the energy at the boost node. That is the reason why the boost-buck converter is the high efficiency converter. FIG. 29A is the basic circuit configuration of the high power efficiency boost-buck converter voltage regulator which has the siphon capability to sip the energy from the $V_{boost}$ node. FIG. 29B is the single input multiple output high power efficiency boost-buck converter voltage regulator which has very important practical applications in the real cases as shown in FIG. 32. Even with the solar energy, we can still have the whole system running at the solar energy. This is the true green technology.

FIG. 30 is the boost-buck converter having the resistorless current sensor and the siphon mechanism made of the magnetic coupled EMI-free planar inductors. The resistorless current sensor is made of the EMI-free planar inductors as shown in FIG. 17. The current flows through the inductor L and induces the proportional current in the magnetic coupled inductor Lc and the resistor Rc. Measuring the voltage Vc across the resistor Rc, we can get the current flowing through the inductor L. The inductor $L_{siph}$ is equivalent to the inductor of the buck converter which can sip the charge from the boost node $V_{boost}$. As the voltage of $V_{boost}$ drops to zero, the NMOS is switched on. This is the voltage switch zero VZS case. In such case, there is no switch loss at the node Vboost.

FIG. 31 is the sequence of the operations of the high power efficiency siphon boost converter voltage regulator. As shown in FIG. 31A, as Vboost=0, switch on the NMOS to build up the inductor current. As the inductor current is equal to the target current, as shown in FIG. 31B, the NMOS is switched off and the inductor current starts to boost up and charge up the parametric capacitors. As the Vchg>Vo, as shown in FIG. 31C, the PMOS switches on and the siphon inductor sips the charges from the parametric capacitors Cparn. As shown in FIG. 31D, the boost voltage decreases to zero due to the sip of the charge from the boosting node; then the boost controller will switch to FIG. 31A state to start the next boost cycle.

Furthermore, with the solar cell as input, the EMI-free planar inductor is applied to the single input multiple output boost-buck converter the $V_{\_LCD}$ and $V_{CC}$ as output where VCC is the power supply of the boost-buck converter circuit itself. As shown in FIG. 32, the EMI-free planar inductor is applied to the single input multiple output boost-buck converter having the solar cell as input, the $V_{\_LCD}$ and $V_{CC}$ as output. $V_{\_LCD}$ is the output for the LCD display. The VCC is the power supply of the boost-buck converter circuit itself. The boost-buck converter not only supplies the power to LCD but also supplies the power to its own circuit.

The V_solar voltage is 300 mV. Therefore, there is a start-up circuit to convert the V_solar to $V_{CC}$=1.2V. As $V_{CC}$=1.2V, the boost-buck converter can take over to have the normal operation. During the start up process, the boost-buck converter is disable. To have the start up circuit, so the Switch Cap Charge Pumping circuit adopts the Intrinsic Device. The intrinsic device has low threshold voltage. However, the intrinsic has large leaky current. So, the start up circuit is disabled as the boost-buck converter can have the normal operation. As the $V_{CC}$=1.2V that the normal device can wok, the start up circuit is disabled. The $V_{CC}$ voltage is compared with the sub-threshold bandgap reference voltage. As $V_{CC}$>1.2V, the start-up circuit is disabled and the boost-buck controller is enabled to have the normal operation.

Figure 33D:
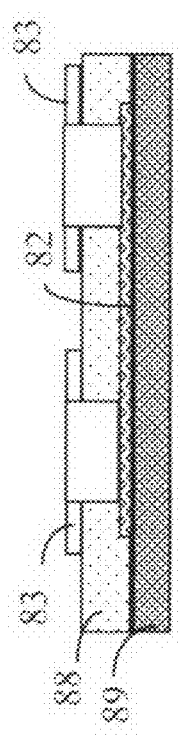
Figure 33E:
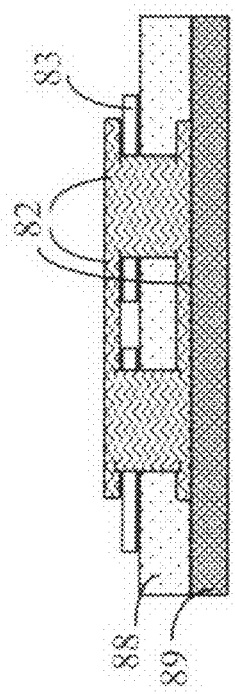
Figure 33A:
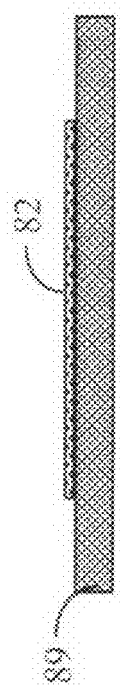
Figure 33B:
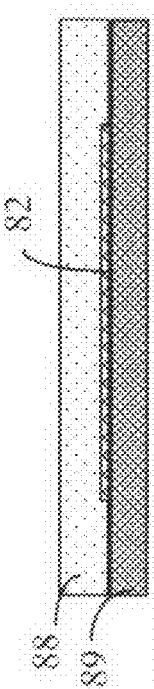
Figure 33C:
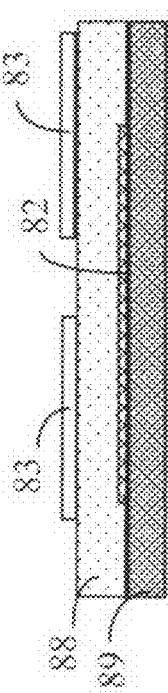

The EMI-free planar manufacture process has to be either IC process technology compatible or it can be post-processed independently. As shown in FIG. 33 is the device process for the EMI-free planar inductor which is the IC process compatible. FIG. 33A is the growth of the bottom magnet core segment. FIG. 33B is the growth of the isolation layer. FIG.

33C is the growth of the coil segment. FIG. 33D is the etching for the magnet core. FIG. 33E is the growth of the top magnet core segment.

Figure 34C:
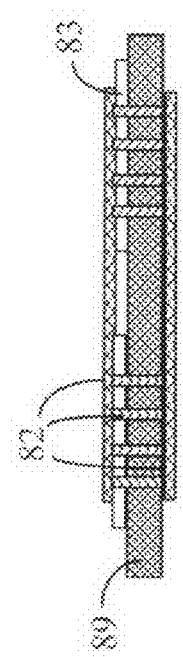

FIG. 34 is the device process for the EMI-free planar inductor which the core magnetic materials can be added by the post processing. FIG. 34A is the growth of the coil segment. FIG. 34B is the etching for the magnet core. It is the cross section view taken at B-B section as shown in FIG. 35. FIG. 34C is the two-side growth of the magnet core segment. FIG. 35 is etching pattern as shown in FIG. 34B. The etch hole punch through the wafer. The magnet particle can attach to the partition slot to fill up the etch hole. This process is simple and efficient. The wafer can rotate in the oven that the deposit of the magnet is even at two sides of this wafer. This is one-time process.

The EMI-free planar inductor technology can be applied to the integrated circuit IC, hybrid circuit and PCB. It is very important for the inductorless switch mode power supply and Xtaless Clock Generator. For the hybrid circuit, it can replace the transformer to reduce the height and weight of the hybrid DC-DC converter. It has the very important application in the Aerospace and Satellite technologies and Industry.

While the invention has been particularly shown and described with reference to the preferred embodiments thereof, it will be understood by those skilled in the art that various changes in form and details may be made therein without departing from the spirit and scope of the invention.

We claim:

1. A device, comprising:
   a magnetic-interference-free inductor,
   said magnetic-interference-free inductor further comprising magnetic guiding or shielding means and inductor means,
   said magnetic guiding and shielding means guiding and confining a magnetic field to provide a magnetic shield for an outside environment and eliminate magnetic interference to an internal circuit,
   wherein said inductor means comprises a plurality of loops directly connected electrically and arranged in a same plane parallel to a surface plane,
   wherein each of the plurality of loops has a center portion,
   wherein one of the plurality of loops provides a magnetic field in an upward vertical direction at the respective center portion while an other of the plurality of loops provides a magnetic field in a downward vertical direction at the respective center portion, wherein said magnetic shielding means covers said plurality of loops.

2. The device according to claim 1, further comprising:
   active device means, amplitude control means or common mode control means;
   said active device means generating negative impedance to provide energy into said LC resonator to provide sustaining oscillation,
   said amplitude control means measuring a first output of said LC resonator to keep an amplitude of said first output to follow target values;
   said common mode control means measuring a second output of said LC resonator to keep a common mode voltage of said second output of said LC resonator to a target value.

3. The device according to claim 1,
   wherein said capacitor means comprises a plurality of varactor means,
   said varactor means being connected to receive a differential voltage control signal to control their respective capacitances;
   said differential voltage signal being correlated to a temperature variation.

4. The device according to claim 2, further comprising: a frequency synthesizer, wherein said frequency synthesizer comprises said magnetic-interference-free inductor.

5. The device according to claim 2, further comprising:
   a programmable integrated circuit heater,
   said programmable integrated circuit heater injecting thermal power to said magnetic-interference-free device to compensate an on-chip temperature,
   wherein temperature compensation parameters of said LC resonator are calculated during a testing process.

6. The device according to claim 5, wherein said programmable integrated circuit heater means comprises a plurality of resistors and a switch means.

7. The device according to claim 5, wherein said programmable integrated circuit heater means comprises a plurality of current sources and a plurality of switches.

8. The device according to claim 1, further comprising:
   a spinning motor means, said spinning motor means comprising a plurality of magnetic pole means;
   said magnetic pole means comprised of said magnetic-interference-free inductor.

9. The device according to claim 8, further comprising a laser TV means,
   said laser TV means comprising RGB laser, means to generate full color light,
   said laser TV means comprising accurate position encoding means,
   said accurate position encoding means comprising said magnetic-interference free inductor;
   said laser TV means further comprising scanning mirror means,
   said scanning mirror means further comprising a horizontal scanning mirror means and a vertical scanning mirror means,
   said vertical scanning mirror means being a reflective mirror means, and
   said horizontal scanning mirror means being a horizontal polygon mirror means or a reflective mirror means.

10. The device according to claim 1 further comprises magnetic-interference-free means and inductor means,
    said magnetic-interference-free means being in continuous non-interrupt loop guiding or confining magnetic field in said magnetic-interference-free means to eliminate magnetic interference and have magnetic shield for both internal circuit means and outside environment.

11. The device according to claim 10 further comprises a chip means having LC resonator means, said chip means having magnetic guiding or shielding means covering on said chip means; said magnetic guiding or shielding means guiding or confining a magnetic field to provide a magnetic shield for an outside environment and eliminate magnetic interference to an internal circuit.

12. The device according to claim 11, wherein magnetic guiding or shielding means of said LC resonator means being made of soft magnetic material.

13. The device according to claim 10 comprises a plural of non-linear Temperature-Coefficient (TC) resonator,
    a programmable electronic heater utilized during testing and calibration only to determine the optimum thermal compensated parameters at coarsely space of temperatures;
    varying said a programmable electronic heater to get optimum parameters stored in nonvolatile memories;

interpolating said stored optimum parameters to compensate said resonator against temperature variation during normal operation.

14. The device according to claim 13, wherein said programmable integrated circuit heater means comprises a plurality of resistors and a switch means.

15. The device according to claim 13, wherein said programmable integrated circuit heater means comprises a plurality of current sources and a plurality of switches.

16. The device according to claim 10, further comprising a plurality of active devices,
said active devices inducing current flow through said magnetic-interference-free inductor.

17. The device according to claim 16,
wherein said active devices are a plurality of switching devices,
wherein said switching devices switch on and off to induce said current flowing through said magnetic-interference-free inductor.

18. The device according to claim 17, further comprising a power converter, wherein said power converter comprises said switching devices and said magnetic-interference-free inductor.

19. The device according to claim 16,
wherein said active devices are a plurality of amplifying devices,
wherein said amplifying devices induce said current flowing through said magnetic-interference-free inductor.

20. The device according to claim 1, further comprising a plurality of reference clock generating means, wherein said reference clock generating means comprises a LC resonator means and generates specified frequencies, wherein said magnetic-interference-free inductor having soft magnetic material to guide or shield said magnetic-interference-free inductor;
a plurality of temperature sensors;
an amplitude controller controlling the amplitude of said LC resonator means correlating to temperature;
a plurality of capacitor banks connecting to said LC resonator means;
a serial interface to control said amplitude controller, said temperature sensors, said plurality of capacitor banks.

* * * * *